United States Patent
Lee et al.

(10) Patent No.: US 10,822,511 B2
(45) Date of Patent: Nov. 3, 2020

(54) INK COMPOSITION FOR PHOTONIC SINTERING AND METHOD FOR PRODUCING SAME

(71) Applicant: KOREA RESEARCH INSTITUTE OF CHEMICAL TECHNOLOGY, Daejeon (KR)

(72) Inventors: Su Yeon Lee, Daejeon (KR); Young Min Choi, Daejeon (KR); Sun Ho Jeong, Daejeon (KR); Beyong Hwan Ryu, Daejeon (KR); Tae Gon Kim, Daejeon (KR); Sang Jin Oh, Jindo-gun (KR); Eun Jung Lee, Daejeon (KR); Ye Jin Jo, Anyang-si (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 0 days.

(21) Appl. No.: 15/770,995

(22) PCT Filed: Oct. 20, 2016

(86) PCT No.: PCT/KR2016/011824
§ 371 (c)(1),
(2) Date: Apr. 25, 2018

(87) PCT Pub. No.: WO2017/073956
PCT Pub. Date: May 4, 2017

(65) Prior Publication Data
US 2018/0312709 A1 Nov. 1, 2018

(30) Foreign Application Priority Data

Oct. 26, 2015 (KR) .................. 10-2015-0148667
Oct. 27, 2015 (KR) .................. 10-2015-0149140

(51) Int. Cl.
| C09D 5/24 | (2006.01) |
| C09D 11/52 | (2014.01) |
| H01B 13/00 | (2006.01) |
| H01B 1/22 | (2006.01) |
| H01B 1/16 | (2006.01) |
| H01B 5/14 | (2006.01) |
| H05K 1/09 | (2006.01) |

(52) U.S. Cl.
CPC ................ *C09D 11/52* (2013.01); *C09D 5/24* (2013.01); *H01B 1/16* (2013.01); *H01B 1/22* (2013.01); *H01B 5/14* (2013.01); *H01B 13/00* (2013.01); *H01B 13/0036* (2013.01); *H05K 1/097* (2013.01)

(58) Field of Classification Search
CPC .......... H05K 1/097; C09D 11/52; C09D 5/25; C23C 24/085; C23C 24/087; C23C 24/08; H01B 1/16; H01B 1/22; H01B 5/14; H01B 13/00
See application file for complete search history.

(56) References Cited

U.S. PATENT DOCUMENTS

| 2008/0087137 A1 | 4/2008 | Shim et al. | |
| 2013/0288892 A1 | 10/2013 | Lauterbach et al. | |
| 2014/0264191 A1* | 9/2014 | Rantala | C09D 11/52 252/513 |
| 2015/0189761 A1* | 7/2015 | Chan | C09D 11/52 427/125 |
| 2017/0253758 A1* | 9/2017 | Druffel | C09D 17/006 |

FOREIGN PATENT DOCUMENTS

| EP | 2130627 A1 | 12/2009 |
| KR | 10-2010-0068278 A | 6/2010 |
| KR | 10-2013-0111180 A | 10/2013 |
| KR | 10-2015-0016139 A | 2/2015 |
| KR | 10-2015-0118801 A | 10/2015 |
| WO | 2014/112683 A1 | 7/2014 |

OTHER PUBLICATIONS

Extended European Search Report of corresponding EP Patent Application No. 16860139.1—8 pages (dated Apr. 11, 2019).
International Search Report of PCT/KR2016/011824 which is the parent application and its English translation—4 pages, (dated Jan. 16, 2017).

* cited by examiner

*Primary Examiner* — Michael P Wieczorek
(74) *Attorney, Agent, or Firm* — Knobbe Martens Olson & Bear LLP

(57) ABSTRACT

An ink composition for photonic sintering and a method or producing the ink composition, the ink composition includes: metal nanoparticles comprising a first metal satisfying interaction formula 1; an organic non-aqueous binder; and a non-aqueous solvent. Interaction formula 1 is $A1/A2 \leq 0.2$, where $A1/A2$ is a ratio, in the x-ray photoelectron spectrum on the surface of the first metal, in which first metal 2p3/2 peak area of the oxide of the first metal ($A1$) is divided by first metal 2p3/2 peak area of the first metal ($A2$).

2 Claims, 6 Drawing Sheets

INK COMPOSITION FOR PHOTONIC SINTERING AND METHOD FOR PRODUCING SAME

TECHNICAL FIELD

The present invention relates to an ink composition for photonic sintering, and more particularly, to an ink composition for photonic sintering capable of producing a conductive thin film having excellent sintering ability even when irradiated with extremely low intensity light to thereby have excellent electrical conductivity, improved moisture resistance, and excellent binding force with a substrate, and a preparation method thereof.

BACKGROUND ART

Research on producing electronic components and energy application components using various printing processes based on an ink and a paste including a metal nanoparticle is one of the megatrends of current technology development.

The ink including the metal nanoparticle has an advantage of simplifying a process by printing metal wiring having a fine pattern on various substrates through single printing processes such as screen printing, inkjet printing, gravure offset printing, reverse offset printing, etc., without using a complicated process of photolithography. In addition, the production cost may be remarkably reduced due to simplification of the process, and a highly integrated and highly efficient printed circuit may be produced by refinement of a wiring width.

The present applicant focused that conductivity of a metal wiring is deteriorated by a surface oxide film present in a metal nanoparticle in a metal nanoparticle-based ink, and provided a method of synthesizing a metal nanoparticle in which formation of the surface oxide film is completely controlled (Korean Patent Laid-Open Publication No. 10-2013-0111180). However, Korean Patent Laid-Open Publication No. 10-2013-0111180 filed by the present applicant has a limitation that an ink containing the metal nanoparticle in which the surface oxide film is controlled is applied to perform thermal sintering, and in order to impart bulk characteristics through the thermal sintering, a high-temperature heat treatment should be performed for a long period of time, specifically 2 hours, at a high temperature of 300° C. or higher in an inert atmosphere. The high-temperature heat treatment over a long period of time has difficulty in using a flexible polymer substrate that is spotlighted as a substrate of a flexible element, and further, it is disadvantageous in a roll-to-roll continuous process having excellent commercial properties.

In particular, since an ink composition containing a copper nanoparticle has a high melting point of 1000° C. or higher, high energy should be applied when producing a conductive thin film using the ink composition, and the produced conductive thin film has low moisture resistance in a high temperature and high humidity environment, and thus specific resistance is rapidly increased.

DISCLOSURE

Technical Problem

An object of the present invention is to provide an ink composition for photonic sintering capable of producing a conductive thin film having excellent sintering ability even when irradiated with extremely low intensity light to thereby have excellent electrical conductivity, improved moisture resistance, and excellent binding force with a substrate, and a preparation method thereof.

Technical Solution

In one general aspect, an ink composition for photonic sintering includes: a metal nanoparticle including a first metal satisfying the following Relational Expression 1; a non-aqueous organic binder; and a non-aqueous solvent.

In another general aspect, a preparation method of an ink composition for photonic sintering includes: a) synthesizing a metal nanoparticle including a first metal satisfying the following Relational Expression 1 by heating and stirring a reaction solution including a metal precursor, an organic acid, an amine-based compound, and a reducing agent; and b) preparing a dispersion in which the metal nanoparticle and a non-aqueous organic binder are dispersed in a non-aqueous solvent.

In still another general aspect, a production method of a photonic sintering conductive thin film includes: A) preparing an ink composition for photonic sintering including a metal nanoparticle including a first metal satisfying the following Relational Expression 1; a non-aqueous organic binder; and a non-aqueous solvent; B) applying the ink composition for photonic sintering to a substrate to form a coating film; and C) irradiating the coating film with light so as to satisfy the following Relational Expression 2 or 3, thereby producing a conductive thin film:

$$A_1/A_2 \leq 0.2 \quad \text{[Relational Expression 1]}$$

$$I_{LS} \leq I_c \quad \text{[Relational Expression 2]}$$

in Relational Expression 1, $A_1/A_2$ is a ratio in which a first metal $2p_{3/2}$ peak area ($A_1$) of an oxide of the first metal is divided by a first metal $2p_{3/2}$ peak area ($A_2$) of the first metal, in X-ray photoelectron spectroscopy spectrum on a surface of the first metal, and in Relational Expression 2, $I_{LS}$ is energy (J/cm$^2$) of light irradiated onto the coating film, and $I_c$ is the maximum energy (J/cm$^2$) of light in which an organic substrate is not deteriorated.

Advantageous Effects

The ink composition for photonic sintering and the preparation method thereof according to the present invention may have the following advantages in production of a conductive thin film.

First, photonic sintering through extremely low light energy with an intensity in which a polymer binder remains on a metal thin film without being carbonized may be performed, and thus it is possible to produce a conductive metal thin film having a significantly excellent electrical conductivity comparable to that of a bulk and having a significantly excellent binding force with a substrate.

Second, the conductive thin film may be produced by a photonic sintering process which is excellent in thermal stability, and thus it is possible to prevent a substrate from being damaged even if the substrate has a low upper temperature limit.

Third, since it is possible to perform a roll-to-roll process, excellent commerciality may be provided, the process may be simplified, and the manufacturing cost may be reduced.

BEST MODE

Figure 1:
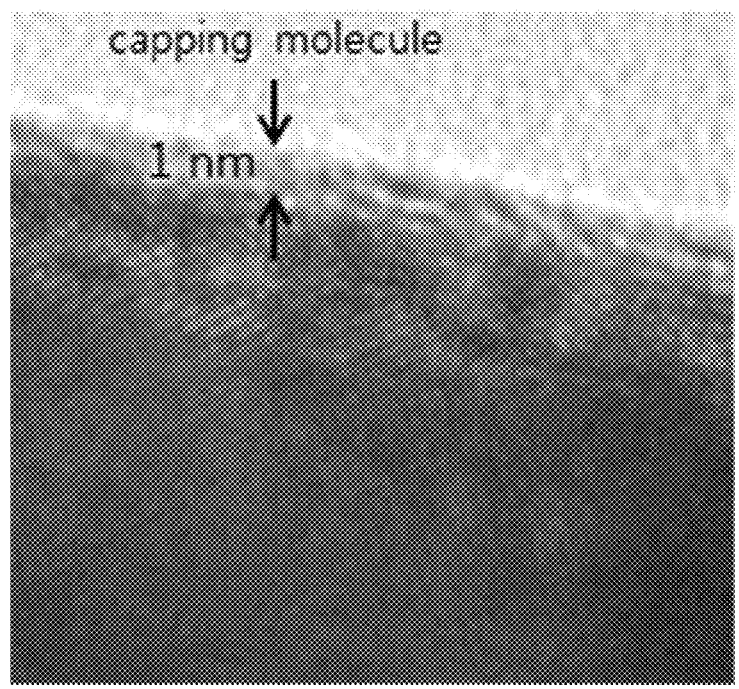
FIG. 1 is a transmission electron microscope image of copper nanoparticles produced according to an embodiment of the present invention.

Hereinafter, an ink composition for photonic sintering of the present invention and a preparation method thereof will be described in detail with reference to the accompanying drawings. The drawings of the present invention to be described below are provided by way of example so that the idea of the present invention can be sufficiently transferred to those skilled in the art to which the present invention pertains. Therefore, the present invention may be implemented in many different forms, without being limited to the drawings to be described below. The drawings below may be exaggerated in order to specify the spirit of the present invention. Here, unless technical and scientific terms used herein are defined otherwise, they have meanings generally understood by those skilled in the art to which the present invention pertains. Description of known functions and components that may unnecessarily obscure the gist of the present invention will be omitted from the following description and the accompanying drawings.

The present applicant intensified study of a metal nanoparticle in which formation of a surface oxide film is controlled proposed in Korean Patent Laid-Open Publication No. 10-2013-0111180, and as a result, found that when photonic sintering an ink composition containing the metal nanoparticle in which a surface oxide film is controlled, a metal thin film having electrical conductivity comparable to that of a bulk could be produced by remarkably low light energy.

Further, the present applicant found that when photonic sintering an ink composition containing a low melting point metal having a relatively lower melting point together with a metal nanoparticle including a first metal in which formation of a surface oxide film is controlled or a metal nanoparticle which is a core-shell nanostructure including the first metal in which formation of the surface oxide film is controlled as a core; a second metal shell surrounding the core; and a capping layer surrounding the second metal shell, a metal thin film having electrical conductivity comparable to that of a bulk could be produced by remarkably low light energy, and surprisingly found that it was possible to produce a conductive metal thin film having an extremely excellent binding force with a substrate which is not capable of being obtained when photonic sintering using a conventional metal nanoparticle-containing ink, and completed the present invention.

In detail, the ink composition for photonic sintering according to an embodiment of the present invention may include a metal nanoparticle including a first metal satisfying the following Relational Expression 1; a non-aqueous organic binder; and a non-aqueous solvent:

$$A_1/A_2 \leq 0.2 \qquad \text{(Relational Expression 1)}$$

in Relational Expression 1, $A_1/A_2$ is a ratio in which a first metal $2p_{3/2}$ peak area ($A_1$) of an oxide of the first metal is divided by a first metal $2p_{3/2}$ peak area ($A_2$) of the first metal, in X-ray photoelectron spectroscopy spectrum on a surface of the first metal. Specifically, the X-ray photoelectron spectroscopy spectrum may be measured using an Al Kα source at a degree of vacuum of $10^{-8}$ or less, and a first metal $2p_{3/2}$ peak of a first metal and a first metal $2p_{3/2}$ peak of a first metal oxide may be extracted, thereby calculating a degree of oxidation through an area ratio between two peaks.

Figure 2:
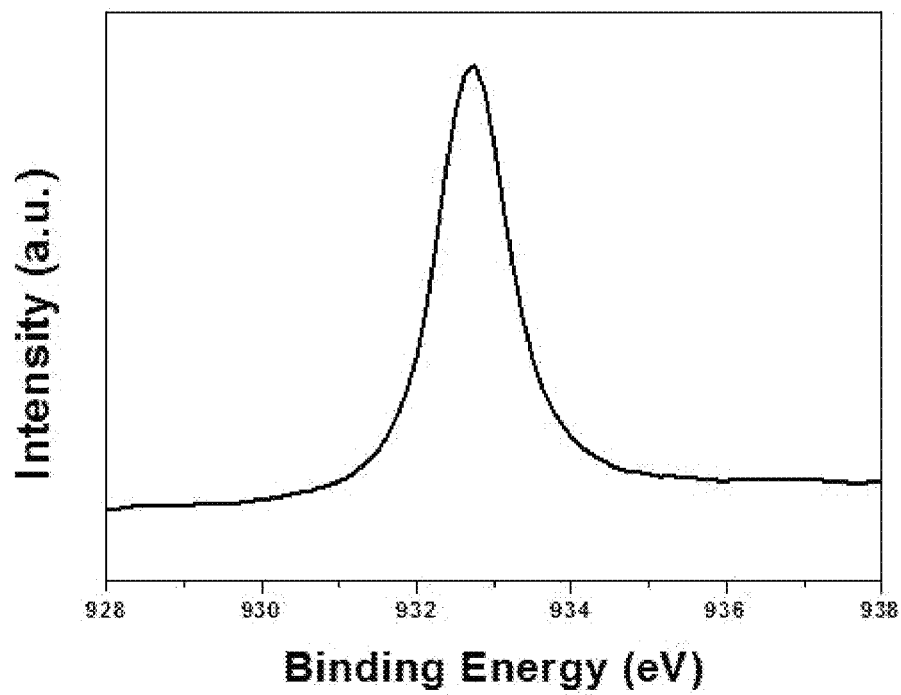
FIG. 2 is an X-ray photoelectron spectroscopy spectrum of the copper nanoparticles produced according to an embodiment of the present invention.

In the metal nanoparticle including the first metal, the first metal may preferably be substantially completely prevented from formation of a surface oxide film. Accordingly, $A_1/A_2$ may be more preferably 0.01 or less. Specifically, as shown in FIG. 2, in the first metal according to an embodiment of the present invention, the first metal $2p_{3/2}$ peak of the oxide of the first metal is not substantially shown, and thus $A_1/A_2$ may be substantially zero. As will be described below, in a production process of the metal nanoparticle including the first metal, the first metal particle may be capped with a first capping layer including a first organic acid, and thus formation of the surface oxide film may be controlled, and preferably, the formation of the surface oxide film may be substantially completely prevented.

In the metal nanoparticle including the first metal according to an embodiment, the first metal may be used without particular limitation as long as it is a metal having excellent electrical conductivity among metals that are generally used for producing a metal thin film. As a specific example, the first metal may be any one or two or more selected from among copper, silver, gold, nickel, tin, aluminum, or an alloy thereof, preferably copper. Copper is a metal having good electrical conductivity after silver, has very good electrical conductivity, and is economical since it is able to be easily supplied and received at a low price.

In an embodiment of the present invention, an average diameter of the metal nanoparticle including the first metal may be 20 to 300 nm, more preferably 50 to 300 nm. In the above-described range, the metal nanoparticles may be tightly packed with each other to be uniformly sintered without a non-sintered region at the time of photonic sintering. A shape of the metal nanoparticle is not particularly limited, but may be an angular polygonal shape, a columnar shape, a spherical shape, or a mixed shape thereof.

More preferably, in an embodiment of the present invention, the metal nanoparticle may be a nanostructure having a core-shell form, including a first metal in which formation of a surface oxide film is controlled as a core and a second metal surrounding the core and forming a solid solution with the first metal. An ink composition containing the metal nanoparticle may be photonic sintered to form a solid solution in which the first metal and the second metal form a completely uniform phase even though light having an extremely low light quantity is irradiated.

That is, the metal nanoparticle according to an embodiment of the present invention may be a core-shell nanostructure including the first metal as the core; a second metal shell surrounding the core; and a capping layer surrounding the second metal shell.

As described above, the first metal core may satisfy the above-described Relational Expression 1, and the formation of the surface oxide film may be substantially completely prevented.

The second metal shell may be capped by the capping layer, and thus formation of a surface oxide film may be controlled, and preferably, the formation of a surface oxide film may also be prevented, and may be substantially completely prevented. In detail, the second metal shell may satisfy the following Relational Expression 3, more preferably $A_{11}/A_{12}$ may be 0.01 or less, and may reach substantially 0 since a $2p_{3/2}$ peak of the second metal oxide is not substantially shown.

$$A_{11}/A_{12} \leq 0.2 \quad \text{(Relational Expression 3)}$$

In Relational Expression 3, $A_{11}/A_{12}$ is a ratio in which a second metal $2p_{3/2}$ peak area ($A_{11}$) of an oxide of the second metal is divided by a second metal $2p_{3/2}$ peak area ($A_{12}$) of the second metal, in X-ray photoelectron spectroscopy spectrum on a surface of the second metal shell. Specifically, the X-ray photoelectron spectroscopy spectrum may be measured using an Al Kα source at a degree of vacuum of $10^{-8}$ or less, and a second metal $2p_{3/2}$ peak of the second metal and a second metal $2p_{3/2}$ peak of the second metal oxide may be extracted, thereby calculating a degree of oxidation through an area ratio between two peaks.

That is, the ink composition for photonic sintering according to an embodiment of the present invention may include a core-shell nanostructure including a first metal satisfying Relational Expression 1 as a core, a second metal shell surrounding the core and satisfying Relational Expression 3, and a capping layer surrounding the second metal shell.

As described above, the ink composition for photonic sintering according to an embodiment of the present invention may include the core-shell nanostructure satisfying Relational Expressions 1 and 3 to thereby have a remarkably excellent sintering ability even at the time of photonic sintering by light irradiation with an extremely low light quantity.

In addition, since the ink composition for photonic sintering has the core-shell shape in which the second metal shell surrounds the first metal core, the first metal and the second metal in the ink composition may be distributed in a uniform ratio, and thus even at the time of photonic sintering by light irradiation with an extremely low light quantity, respective metals may be easily connected to each other and uniformly mixed to form a more perfect solid solution.

The solid solution refers to a material in which atoms of two or more different elements are homogeneously mixed, and is formed when another atom is added to a base material and an existing base material lattice structure is maintained without forming a new structure. In the present invention, the solid solution may mean that the second metal is penetrated into the first metal, which is the base material, to form a single-phase solution.

Specifically, in the present invention, the solid solution is a second metal atom that is penetrated into the first metal which is the base material, and may be divided into an intrusion type and a substitution type depending on its form. The intrusion type may be a type in which the second metal atom is interposed between first metal lattice structures, and the intrusion type solid solution may be formed when an atomic radius of the second metal atom is significantly smaller than that of the first metal atom. The substitution type may be a type in which the second metal atom is substituted with the first metal atom, and the substitution type solid solution may be formed when it is difficult to interpose the second metal atom between the first metal lattice structures since the atomic radius of the second metal atom is similar to that of the first metal atom.

The solid solution may control physical properties depending on the kind and content of the first metal and the second metal, and thus it is possible to control the kind and the content of the first metal and the second metal according to the physical properties required by the conductive thin film to be produced after photonic sintering.

For example, according to the kind of the first metal and the second metal, the solid solution may be divided into a complete solid solution and a limited solid solution. The complete solid solution may be formed regardless of a content of the first metal and the second metal, and has an advantage in that the content is able to be freely controlled according to desired physical properties. Meanwhile, in the limited solid solution, the second metal may not be penetrated into the first metal at a specific content or more, that is, a solubility limit is determined, and thus a content ratio of the first metal and the second metal may be controlled within a content range at which the solid solution is capable of being formed.

Specifically, the first metal as the core may be used without particular limitation as long as it is a metal having a high electrical conductivity among metals that are conventionally used for producing a metal thin film. In a more specific example, the first metal core may be copper, silver, gold, nickel, tin, aluminum, or an alloy thereof. The second metal may form a solid solution with the first metal, may maintain excellent electrical conductivity at the time of forming the solid solution, and may be selected from metals capable of improving physical properties such as moisture resistance, corrosion resistance, etc. In a more specific example, the second metal shell is copper, silver, gold, nickel, tin, aluminum or an alloy thereof, wherein the first metal core and the second metal shell are different metals.

In particular, preferably, the first metal core may be copper and the second metal shell may be nickel. That is, the ink composition for photonic sintering according to an embodiment of the present invention may include a core-shell nanostructure including a copper core satisfying Relational Expression 1; a nickel shell surrounding the copper core and satisfying Relational Expression 3; and a capping layer surrounding the nickel shell.

Copper and nickel may have the same face centered cubic (FCC) and may have similar atomic radius, electron affinity, and valence electron number, thereby forming the complete solid solution. Accordingly, physical properties of the conductive thin film may be controlled by freely controlling the content of copper and nickel. In particular, by using copper having excellent electrical conductivity and nickel having excellent oxidation stability, it is possible to produce a photonic sintered conductive thin film having excellent electrical conductivity and improved moisture resistance.

In an example, a molar ratio between copper and nickel may be 1:0.1 to 1, and more preferably 1:0.3 to 0.6. In this range, the conductive thin film produced after photonic sintering may effectively maintain the electrical conductivity and effectively improve the moisture resistance, thereby suppressing a rapid increase in specific resistance in a high temperature and high humidity environment. In a specific example, when forming a conductive thin film, which is a solid solution through photonic sintering using a core-shell nanostructure in which copper is coated with nickel having excellent oxidation stability, a resistance change ($R/R_0$) of the conductive thin film may be remarkably suppressed to 1.2 times or less the initial resistance in a high temperature and high humidity environment of humidity of 85%/temperature of 85° C. Here, in the resistance change $R/R_0$, R is a resistance after 24 hours, and $R_0$ is a resistance of the initial conductive thin film.

Here, the copper core satisfies Relational Expression 1, and $A_1/A_2$ in Relational Expression 1 is a ratio in which a Cu $2p_{3/2}$ peak area ($A_1$) of an oxide of copper is divided by a Cu $2p_{3/2}$ peak area ($A_2$) of copper, in X-ray photoelectron spectroscopy spectrum on a surface of the copper core. Specifically, X-ray photoelectron spectroscopy spectrum may be measured under 920-960 eV binding energy condition using an Al Kα source at a degree of vacuum of $10^{-8}$ or lower, and Cu $2p_{3/2}$ peaks of copper and copper oxide may be extracted, thereby calculating a degree of oxidation through an area ratio between two peaks. Similarly, the nickel shell satisfies Relational Expression 3, and more specifically, $A_{11}/A_{12}$ in Relational Expression 3 is a ratio in which a Ni $2p_{3/2}$ peak area ($A_{11}$) of an oxide of nickel is divided by a Ni $2p_{3/2}$ peak area ($A_{12}$) of nickel, in X-ray photoelectron spectroscopy spectrum on a surface of the nickel shell. Specifically, X-ray photoelectron spectroscopy spectrum may be measured under 840-860 eV binding energy condition using an Al Kα source at a degree of vacuum of $10^{-8}$ or lower, and Ni $2p_{3/2}$ peaks of nickel and nickel oxide may be extracted, thereby calculating a degree of oxidation through an area ratio between two peaks.

In addition, as described above, the second metal shell according to an embodiment of the present invention may be capped with a capping layer, and more specifically, the capping layer may contain an organic acid. Since the organic acid may be preferentially chemisorbed onto the second metal shell to form a dense organic acid film, the capping layer may be formed of the organic acid. That is, the capping layer may be a film of the organic acid that is chemisorbed onto the second metal shell. However, as described below in the preparation method of an ink composition, a small amount of amine may be included in the capping layer in a production process using the organic acid and the organic amine together. As the second metal shell is capped with the capping layer including the organic acid, formation of the surface oxide film of the second metal shell may be prevented.

As a specific example, the organic acid may have at least one of a straight chain form, a branched form or a cyclic form having 6 to 30 carbon atoms, and may be one or two or more selected from saturated or unsaturated organic acids. More specifically, the organic acid may be one or two or more selected from the group consisting of oleic acid, lysine oleic acid, stearic acid, hydroxystearic acid, linoleic acid, aminodecanoic acid, hydroxydecanoic acid, lauric acid, decenoic acid, undecenoic acid, palmitoleic acid, hexyldecanoic acid, hydroxypalmitic acid, hydroxymyristic acid, hydroxydecanoic acid, palmitoleic acid, and myristoleic acid, etc., but is not limited thereto.

The capping layer for capping the second metal shell may have a thickness of 1 to 2 nm. When the capping layer is extremely thin, an effect of preventing the formation of the oxide film may be reduced. In addition, when the thickness of the capping layer is extremely thick, excessive energy and time may be consumed for removing the capping layer which is an organic material in the production of the metal thin film using the ink composition including the core-shell nanostructure.

As described above, the ink composition for photonic sintering according to an embodiment of the present invention may include the core-shell nanostructure including the first metal core satisfying Relational Expression 1 and the second metal shell surrounding the first metal core, and thus it is possible to form a perfect solid solution having remarkably excellent sintering ability even at the time of photonic sintering by light irradiation with an extremely low light quantity.

Meanwhile, the ink composition according to an embodiment of the present invention may further include a metal having a relatively lower melting point than that of the metal nanoparticle in order to have significantly excellent sintering ability in spite of light irradiation with extremely low intensity at the time of photonic sintering, secure significantly excellent electrical conductivity and binding force with a substrate, and improve flowability of the metal, thereby completely performing the sintering process even with lower light energy.

Specifically, the ink composition according to an embodiment of the present invention may further include a low melting point metal having a melting point of 800° C. or lower.

The low melting point metal in the present invention has a relatively low melting point as compared to that of the metal nanoparticle, and specifically may refer to a metal having a melting point of 800° C. or lower, more specifically, a melting point of 150 to 800° C., and may be a single metal or an alloy of two or more metals. By using the low melting point metal having a melting point of 800° C. or lower together with the metal nanoparticle, the ink composition may have significantly excellent sintering ability even though light irradiation is performed with an extremely low intensity at the time of photonic sintering the ink composition, and the photonic sintering through an extremely low light energy with an intensity in which the polymer binder remains on the metal thin film without being carbonized may be performed, thereby producing a conductive metal thin film not only having a significantly excellent electrical conductivity comparable to that of a bulk, but also having a significantly excellent binding force with a substrate.

Specifically, the low melting point metal may be more easily melted as compared to the metal nanoparticle by light irradiation. Due to this property, flowability of the metal may be improved even at the time of light irradiation with extremely low energy to thereby produce a conductive thin film which is uniformly and well photonic sintered over the entire region, even in a non-sintered region, and the produced conductive thin film may have significantly excellent electrical conductivity. Further, since the irradiation is performed with light with an extremely low intensity, thermal stability may be excellent, and thus even if a substrate has a very low upper temperature limit of 200° C. or lower, the substrate may be prevented from being damaged in a step of forming a conductive thin film, and a conductive thin film having excellent electrical conductivity even if it is any substrate may be formed.

The low melting point metal according to an embodiment of the present invention may have a relatively low melting point as compared to the metal nanoparticle. Specific examples of the low melting point metal may include an alloy composed of two or more metals selected from copper, tin, silver, bismuth, zinc, indium, and lead. Here, the kind and the content of the low melting point metal may be controlled in consideration of physical properties required for the conductive thin film to be produced. Preferably, an alloy containing the same metal as the metal nanoparticle is preferably the low melting point metal. Specifically, when the alloy containing the same metal as the metal nanoparticle is used as the low melting point metal, the metal nanoparticle and the low melting point metal may be more easily fused at the time of photonic sintering, thereby having excellent sintering ability. As the low melting point metal is melted, the same metal as the low melting point metal may be contained and the metal nanoparticle may be affected, and thus the sintering may be more effectively performed even with lower energy injection.

More specifically, when the metal nanoparticle is copper, the low melting point metal may be a copper-tin-based alloy. A melting point of copper is about 1,083° C., and when an alloy is produced by mixing tin together with copper, an alloy having a melting point significantly lower than that of a single copper metal may be obtained. The melting point of the copper-tin-based alloy depends on how a ratio of the two metals is controlled. Preferably, copper and tin are mixed so as to have a melting point of 800° C. or lower.

As a preferred example, the copper-tin-based alloy may satisfy the following Chemical Formula 1:

$$Cu_1Sn_x \qquad \text{[Chemical Formula 1]}$$

in Chemical Formula 1, x is 0.1≤x≤2.

When a conductive thin film is produced through photonic sintering by using a copper-tin-based alloy satisfying Chemical Formula 1 as a low melting point metal, it is possible to produce a conductive thin film having excellent electrical conductivity by having an excellent sintering ability even when irradiated with extremely low intensity light, and to prevent deterioration of mechanical properties of the conductive thin film.

As an example, an average diameter of the copper-tin-based alloy may be less than 0.414 times the average diameter of the metal nanoparticle. The copper-tin-based alloy may be interposed between the metal nanoparticles in the above-described size range to thereby maximize a particle filling effect, and thus light sintering ability may be further improved.

As a more specific example, the average diameter of the copper-tin-based alloy may be 5 to 300 nm, and more preferably 20 to 200 nm. In the above-described range, the metal nanoparticle and the copper-tin-based alloy may be tightly packed, and may be uniformly sintered at the time of photonic sintering in non-sintered region when irradiated with extremely low intensity light, and the flowability of the metal may be effectively improved. A shape of the copper-tin-based alloy is not particularly limited, but may be an angular polygonal shape, a columnar shape, a spherical shape, a core-shell shape, or a mixed shape thereof. The copper-tin-based alloy may be added in a content of 0.1 to 50 parts by weight based on 100 parts by weight of the metal nanoparticle, but the content thereof is not necessarily limited thereto. Mixing in the above-described range may prevent deterioration of electrical conductivity and mechanical properties of the conductive thin film.

Further, the low melting point metal may also be synthesized, as described below, by the same production method as the metal nanoparticle to thereby be capped with a capping layer including an organic acid, and thus the formation of the surface oxide film may be controlled, and preferably, the formation of the surface oxide film may be substantially completely prevented. Specifically, the low melting point metal may satisfy the following Relational Expression 4, and more preferably $A_{21}/A_{22}$ may be 0.01 or less. The $2p_{3/2}$ peak of the oxide of the low melting point metal is not substantially shown, and thus $A_{21}/A_{22}$ may be substantially zero.

$$A_{21}/A_{22} \leq 0.2 \qquad \text{[Relational Expression 4]}$$

In Relational Expression 4, $A_{21}/A_{22}$ is a ratio in which a metal $2p_{3/2}$ peak area ($A_{21}$) of an oxide of a low melting point metal is divided by a metal $2p_{3/2}$ peak area ($A_{22}$) of the low melting point metal, in X-ray photoelectron spectroscopy spectrum on a surface of the low melting point metal. Specifically, X-ray photoelectron spectroscopy spectrum may be measured using an Al Kα source at a degree of vacuum of $10^{-8}$ or lower, and metal $2p_{3/2}$ peaks of the low melting point metal and the oxide of the low melting point metal may be extracted, thereby calculating a degree of oxidation through an area ratio between two peaks. However, since the low melting point metal is an alloy in which two or more kinds of metals are mixed, the metal $2p_{3/2}$ peak area ($A_{21}$) of the oxide of the low melting point metal may be the sum of metal $2p_{3/2}$ peak areas of oxides of the respective metals contained in the low melting point metal, and the metal $2p_{3/2}$ peak area ($A_{22}$) of the low melting point metal may be the sum of metal $2p_{3/2}$ peak areas of the respective metals contained in the low melting point metal.

That is, the ink composition for photonic sintering according to an embodiment of the present invention may include: the metal nanoparticle including the first metal satisfying the following Relational Expression 1; the low melting point metal satisfying the following Relational Expression 4 and having a melting point of 800° C. or less; a non-aqueous organic binder; and a non-aqueous solvent.

As described above, the ink composition for photonic sintering according to an embodiment of the present invention may include the metal nanoparticle including the first metal satisfying Relational Expression 1 and the low melting metal satisfying Relational Expression 4 to thereby be capable of producing the conductive metal thin film having remarkably excellent sintering ability even at the time of photonic sintering through light irradiation with extremely low intensity, having excellent electrical conductivity, and significantly excellent binding force with a substrate.

As described above continuously, since the ink composition for photonic sintering according to an embodiment of the present invention contains the metal nanoparticle including the first metal satisfying Relational Expression 1, sintering may be effectively performed without damaging the substrate even when irradiated with light having extremely low light quantity, and further, surprisingly, the ink composition may be sintered so as to have electrical conductivity comparable to that of the bulk even in a state in which the polymer binder is not carbonized but remains while maintaining original physical properties of the polymer binder.

In detail, the ink composition for photonic sintering according to an embodiment of the present invention may produce a conductive thin film by light irradiation with extremely low energy satisfying the following Relational Expression 2:

$$I_{LS} \leq I_c \qquad \text{[Relational Expression 2]}$$

in Relational Expression 2, $I_{LS}$ is energy (J/cm²) of light irradiated onto the coating film, and $I_c$ is the maximum energy (J/cm²) of light in which an organic substrate is not deteriorated.

Accordingly, it is possible to produce a conductive thin film having an electrical conductivity comparable to that of the bulk in the state in which the non-aqueous organic binder contained in the ink is not carbonized but remains on a thin film while maintaining physical properties of the binder itself, preventing deterioration of a low-cost transparent polymer substrate such as polyethersulfone (PES), polyethylene naphthalate (PEN), polyethylene terephthalate (PET), or the like, and having remarkable binding force with the substrate.

This photonic sintering condition has not been known and has not been studied in the field of a production method of metal wiring using photonic sintering according to the related art, and is a condition that is only obtained when photonic sintering the ink composition containing the metal nanoparticle including the first metal satisfying Relational Expression 1.

That is, the production method of the conductive thin film according to the present invention may have a characteristic constitution in which a light quantity of light that is sintered to have electrical conductivity comparable to that of the bulk is lower than a light quantity of light that does not deteriorate the organic substrate without carbonizing the polymer binder.

Since the polymer binder mixed with the metal nanoparticle may remain and thermal stability is excellent enough not to deteriorate the organic substrate, the method is advantageous in that it is possible to produce a conductive metal thin film having excellent electrical conductivity comparable to that of bulk without damaging the substrate even if the substrate has a very low upper temperature limit of 100° C. or less, and it is possible to produce a conductive metal thin film which is very suitable for flexible components since binding force between the metal thin film and the substrate is extremely excellent due to the remaining polymer binder. In addition, since the photonic sintering process may be used, it is possible to produce a film having a large area in a very short time in the atmosphere, which is an advantage of the photonic sintering, and a roll-to-roll process may be implemented, and thus commerciality may be excellent, the process may be simplified, and production cost may be reduced.

More specifically, the light irradiated onto the coating film may vary depending on characteristics of the ink composition for photonic sintering.

As a specific example, when the metal nanoparticle included in the ink composition for photonic sintering is a core-shell nanostructure, a conductive thin film may be produced through light irradiation with an extremely low energy. More specifically, the metal nanoparticle may be a core-shell nanostructure including the first metal as the core, the second metal shell surrounding the core; and the capping layer surrounding the second metal shell.

In this case, it is possible to produce a conductive thin film in which a perfect solid solution is formed by irradiating the coating film with light having an extremely low light quantity satisfying Relational Expression 2.

As described above, by irradiating light satisfying Relational Expression 2, a perfect solid solution may be formed, and a conductive metal thin film in which the polymer binder remains while having electrical conductivity comparable to that of the bulk may be produced.

As a specific example, light having a light quantity of 2.6 J/cm$^2$ or less may be irradiated. In particular, in the case of the ink composition for photonic sintering including a core-shell nanostructure composed of a copper core and a nickel shell, the ink composition may be sintered through light irradiation with an extremely low light quantity of 2.6 J/cm$^2$ or less to form the perfect solid solution, and thus the conductive thin film produced from the ink composition may have excellent electrical conductivity and improved moisture resistance.

In another specific embodiment, when the ink composition for photonic sintering further includes a low melting point metal having a melting point of 800° C. or less, the conductive thin film having excellent electrical conductivity may be produced by irradiating light onto the coating film so as to satisfy Relational Expression 2.

As a specific example, when the conductive ink for photonic sintering further includes a low melting point metal having a melting point of 800° C. or less, light having an energy of 1.3 J/cm$^2$ or less may be irradiated. In particular, in the case of an ink composition for photonic sintering including a copper metal nanoparticle and a copper-tin-based alloy, the ink composition may be sintered through light irradiation with an extremely low energy of 1.3 J/cm$^2$ or less, and may have excellent photonic sintering ability, thereby having excellent electrical conductivity.

Meanwhile, the ink composition according to the present invention may include a non-aqueous organic binder and a non-aqueous solvent as described above.

The non-aqueous organic binder is not particularly limited, but may be any non-aqueous organic binder material that is conventionally used to improve physical binding force of the coating film when preparing the conductive ink. As a specific and non-limiting example, the non-aqueous organic binder may be one or two or more selected from polyvinylidene fluoride (PVDF), polymethylmethacrylate (PMMA), self-crosslinkable acrylic resin emulsion, hydroxyethyl cellulose, ethylhydroxyethyl cellulose, carboxymethyl cellulose, hydroxycellulose, methylcellulose, nitrocellulose, ethylcellulose, styrene butadiene rubber (SBR), a copolymer of C1-C10alkyl(meth)acrylate and unsaturated carboxylic acid, gelatin, thixoton, starch, polystyrene, polyurethane, a resin including a carboxylic group, a phenolic resin, a mixture of ethylcellulose and a phenolic resin, an ester polymer, a methacrylate polymer, a self-crosslinking (meth)acrylic acid copolymer, a copolymer having an ethylenic unsaturated group, an ethylcellulose-based material, an acrylate-based material, an epoxy resin-based material, and a mixture thereof.

As a more specific example, the non-aqueous organic binder may be a non-aqueous polymer material having an amine value of 5 to 150 mgKOH/g. The non-aqueous polymer material may simultaneously perform a role of a binder and a dispersant. In particular, the non-aqueous organic binder may be a copolymer of an unsaturated carboxylic acid or a graft polymer thereof, and may be a copolymer of an unsaturated carboxylic acid or a graft polymer thereof having an amine value of 5 to 150 mgKOH/g. The non-aqueous organic binder does not interfere with binding between the metal particles at the time of photonic sintering, while simultaneously acting as the binder and the dispersant, and thus a metal thin film that is more compact and has excellent conductivity may be produced. The copolymer of unsaturated carboxylic acid or the graft polymer thereof having an amine value of 5 to 150 mg KOH/g may include a copolymer of C1-C10alkyl(meth)acrylate and unsaturated carboxylic acid, a copolymer of polyetherketone and unsaturated carboxylic acid, a copolymer of polyacrylamide and unsaturated carboxylic acid, a copolymer of polyethylene oxide and unsaturated carboxylic acid, a copolymer of polyethylene glycol and unsaturated carboxylic acid or a mixture thereof. The copolymer of unsaturated carboxylic acid or the graft polymer thereof having an amine value of 5 to 150 mg KOH/g may have a weight average molecular weight of 1000 to 50000 g/mol.

As the non-aqueous organic binder, a commercial product containing the non-aqueous organic binder material may be used. Specific examples of the non-aqueous organic binder may include BYK130, BYK140, BYK160, BYK161, BYK162, BYK163, BYK164, BYK165, BYK167, BYK169, BYK170, BYK171, BYK174 EFKA 4610, EFKA 4644, EFKA 4654, EFKA 4665, EFKA 4620, EFKA 4666, EFKA 4642, or the like, but the non-aqueous organic binder is not limited thereto.

The non-aqueous solvent is not particularly limited, but preferably may be one or two or more selected from the group consisting of alkane having 6 to 30 carbon atoms, amine, toluene, xylene, chloroform, dichloromethane, tetradecane, octadecene, chlorobenzene, dichlorobenzene, chlorobenzoic acid, and dipropylene glycol propyl ether, and a content thereof may be controlled so as to have suitable fluidity for coating or printing.

In an embodiment of the present invention, the ink composition for photonic sintering may contain 0.05 to 5 parts by weight of the non-aqueous organic binder and 20 to 800 parts by weight of the non-aqueous solvent, based on 100 parts by weight of the metal nanoparticle.

According to an embodiment of the present invention, the non-aqueous organic binder may remain on the conductive metal thin film without impairing inherent physical properties thereof at the time of photonic sintering. Accordingly, when the content of the non-aqueous organic binder in the conductive ink composition is extremely high, densification between the metal nanoparticles may be inhibited by the polymer binder that binds between the metal nanoparticles or between the metal nanoparticle and the substrate. A content range of 0.05 to 5 parts by weight of the non-aqueous organic binder based on the particles may be a range in which the densification between metal nanoparticles may not be interfered, and a coating film having physical strength in which a shape is stably maintained when the applied ink composition is dried and having excellent binding force with a substrate may be formed, and at the same time, the binding force between the substrate metal thin films may be remarkably improved by the polymer binder remaining on the metal thin film after photonic sintering.

The conductive ink composition may contain 20 to 800 parts by weight of a non-aqueous solvent to have proper fluidity for coating or printing even though it may vary to some extent depending on an application method of the conductive ink composition.

Further, another aspect of the present invention relates to a preparation method of an ink composition for photonic sintering.

In detail, the preparation method of an ink composition for photonic sintering may include: a) synthesizing a metal nanoparticle including a first metal satisfying the following Relational Expression 1 by heating and stirring a reaction solution including a metal precursor, an organic acid, an amine-based compound, and a reducing agent; and b) preparing a dispersion in which the metal nanoparticle and a non-aqueous organic binder are dispersed in a non-aqueous solvent, $A_1/A_2 \leq 0.2$ (Relational Expression 1)

in Relational Expression 1, $A_1/A_2$ is a ratio in which a first metal $2p_{3/2}$ peak area ($A_1$) of an oxide of the first metal is divided by a first metal $2p_{3/2}$ peak area ($A_2$) of the first metal, in X-ray photoelectron spectroscopy spectrum on a surface of the first metal.

In step a), preparing of the metal nanoparticle capped with the capping layer may be performed with reference to Korean Patent Laid-Open Publication No. 10-2013-0111180 filed by the present applicant, and the entire disclosure of which is incorporated herein by reference.

Specifically, step a) may include preparing the metal nanoparticle including a first metal that prevents a surface oxide film from being formed and is capped with a capping layer by heating a reaction solution including a metal precursor, an organic acid, an amine-based compound and a reducing agent. However, the heating and stirring may be performed in an inert atmosphere.

Here, the capping layer may contain an organic acid. Since the organic acid may be preferentially chemisorbed onto the first metal particle to form a dense organic acid film, the capping layer may be formed of the organic acid. That is, the capping layer may be a film of the organic acid that is chemisorbed onto the first metal particle included in the metal nanoparticle. However, a small amount of amine may be included in the capping layer in the production process using an organic acid and an amine-based compound together. As the first metal particle is capped with the capping layer including the organic acid, formation of the surface oxide film of the first metal particle may be prevented.

The metal of the metal precursor is to form the metal nanoparticle including the first metal, and may be one or two or more selected from the group consisting of copper, silver, gold, nickel, tin, aluminum and an alloy thereof. The metal precursor may be one or more inorganic salts selected from the group consisting of nitrate, sulfate, acetate, phosphate, silicate and hydrochloride of a metal selected from the group consisting of copper, silver, gold, nickel, tin, aluminum and an alloy thereof.

The organic acid may have at least one of a straight chain form, a branched form or a cyclic form having 6 to 30 carbon atoms, and may be one or two or more selected from saturated or unsaturated acids. More specifically, the organic acid may be one or two or more selected from the group consisting of oleic acid, lysine oleic acid, stearic acid, hydroxystearic acid, linoleic acid, aminodecanoic acid, hydroxydecanoic acid, lauric acid, decenoic acid, undecenoic acid, palmitoleic acid, hexyldecanoic acid, hydroxypalmitic acid, hydroxymyristic acid, hydroxydecanoic acid, palmitoleic acid, and myristoleic acid, etc., but is not limited thereto. In the first solution, a molar ratio of the metal precursor and the organic acid may be 1 (metal precursor): 0.2 to 4 (acid).

The amine-based compound may have at least one of a straight chain form, a branched form or a cyclic form having 6 to 30 carbon atoms, and may be one or two or more selected from saturated and unsaturated amine. More specifically, the amine-based compound may be selected from hexylamine, heptylamine, octylamine, dodecylamine, 2-ethylhexylamine, 1,3-dimethyl-n-butylamine, and 1-aminotridecane, etc., but is not limited thereto. A content of the amine-based compound in the first solution is 0.2 mol or more, preferably 1 to 50 mol, and more preferably 5 to 50 mol based on 1 mol of the metal precursor, but the upper limit is not limited since the amine-based compound may act as the non-aqueous solvent.

The reducing agent may be one or two or more selected from hydrazine-based reducing agents including hydrazine, hydrazine anhydride, hydrazine hydrochloride, hydrazine sulfate, hydrazine hydrate, and phenylhydrazine. Further, in addition thereto, the reducing agent may be one or two or more selected from hydride-based; borohydride-based including tetrabutylammonium borohydride, tetramethylammonium borohydride, tetraethylammonium borohydride, and sodium borohydride, etc.; sodium phosphate-based; and ascorbic acid. In the first solution, the reducing agent may be included so that a molar ratio of the reducing agent and the metal precursor is 1 to 100.

In step a), the synthesizing of the metal nanoparticle is not significantly limited, but in consideration of a reduction efficiency, the synthesizing of the metal nanoparticle may be performed at 80 to 300° C., more preferably 100 to 250° C., and further more preferably 130 to 200° C., and may be performed in an inert atmosphere. The metal nanoparticle may be separated and recovered by a conventional method used when recovering the nanoparticle, such as centrifugation.

In an embodiment of the present invention, when the metal nanoparticle is a nanostructure having a core-shell structure as described above, step a) may include a-1) synthesizing a first metal core satisfying the following Relational Expression 1 by heating and stirring a first solution including a first metal precursor, a first organic acid, a first amine-based compound, and a first reducing agent; and a-2) synthesizing a core-shell nanostructure having a structure in which the first metal core, a second metal shell, and a second capping layer are sequentially positioned from inside to outside by heating and stirring the first metal core, and a second solution including a second metal precursor, a second organic acid, a second amine-based compound, and a second reducing agent:

$$A_1/A_2 \leq 0.2 \quad \text{(Relational Expression 1)}$$

in Relational Expression 1, $A_1/A_2$ is a ratio in which a first metal $2p_{3/2}$ peak area ($A_1$) of an oxide of the first metal is divided by a first metal $2p_{3/2}$ peak area ($A_2$) of the first metal, in X-ray photoelectron spectroscopy spectrum on a surface of the first metal.

Specifically, step a-1) is a step of preparing a first metal core that prevents a surface oxide film from being formed and is capped with a first capping layer by heating a first solution including a first metal precursor, a first organic acid, a first amine-based compound and a first reducing agent, wherein the heating and stirring may be performed in an inert atmosphere.

Here, the first capping layer may contain the first organic acid. Since the first organic acid may be preferentially chemisorbed onto the first metal to form a dense organic acid film, the first capping layer may be formed of the first organic acid. That is, the first capping layer may be a film of the first organic acid that is chemisorbed onto the first metal. However, a small amount of amine may be included in the first capping layer in the production process using the first organic acid and the first amine-based compound together. As the first metal is capped with the first capping layer including the first organic acid, formation of the surface oxide film of the first metal particle may be prevented.

The metal of the first metal precursor may be one or two or more selected from the group consisting of copper, silver, gold, nickel, tin, aluminum and an alloy thereof. The first metal precursor may be one or more inorganic salts selected from the group consisting of nitrate, sulfate, acetate, phosphate, silicate, and hydrochloride of a metal selected from the group consisting of copper, silver, gold, nickel, tin, aluminum, and an alloy thereof.

The first organic acid may have at least one of a straight chain form, a branched form or a cyclic form having 6 to 30 carbon atoms, and may be one or two or more selected from saturated or unsaturated acids. More specifically, the first organic acid may be one or two or more selected from the group consisting of oleic acid, lysine oleic acid, stearic acid, hydroxystearic acid, linoleic acid, aminodecanoic acid, lauric acid, decenoic acid, undecenoic acid, hexyldecanoic acid, hydroxypalmitic acid, hydroxymyristic acid, hydroxydecanoic acid, palmitoleic acid, and myristoleic acid, etc., but is not limited thereto. In the first solution, a molar ratio of the first metal precursor and the first organic acid may be 1 (metal precursor):0.2 to 4 (acid).

The first amine-based compound may have at least one of a straight chain form, a branched form or a cyclic form having 6 to 30 carbon atoms, and may be one or two or more selected from saturated and unsaturated amine. More specifically, the first amine-based compound may be selected from hexylamine, heptylamine, octylamine, dodecylamine, 2-ethylhexylamine, 1,3-dimethyl-n-butylamine, and 1-aminotridecane, etc., but is not limited thereto. A content of the first amine-based compound in the first solution is 0.2 mol or more, preferably 1 to 50 mol, and more preferably 5 to 50 mol based on 1 mol of the first metal precursor, but the upper limit is not necessarily limited since the first amine-based compound may act as the non-aqueous solvent.

The first reducing agent may be one or two or more selected from hydrazine-based reducing agents including hydrazine, hydrazine anhydride, hydrazine hydrochloride, hydrazine sulfate, hydrazine hydrate, and phenylhydrazine. Further, in addition thereto, the first reducing agent may be one or two or more selected from hydride-based; borohydride-based including tetrabutylammonium borohydride, tetramethylammonium borohydride, tetraethylammonium borohydride, and sodium borohydride, etc.; sodium phosphate-based; and ascorbic acid. In the first solution, the first reducing agent may be included so that a molar ratio of first reducing agent and the first metal precursor is 1 to 100.

In step a), the synthesizing of the first metal nanoparticle is not significantly limited, but in consideration of a reduction efficiency, the synthesizing of the first metal nanoparticle may be performed at 80 to 300° C., more preferably 100 to 250° C., and further more preferably 130 to 200° C., and may be performed in an inert atmosphere. The first metal nanoparticle may be separated and recovered by a conventional method used when recovering the nanoparticle, such as centrifugation.

Next, step a-2) may be performed.

Specifically, step a-2) is a step of preparing a core-shell nanostructure having a structure in which the first metal core satisfying Relational Expression 1, a second metal shell, and a second capping layer are sequentially positioned from inside to outside by heating the first metal core, and a second solution including a second metal precursor, a second organic acid, a second amine-based compound, and a second reducing agent, wherein the heating and stirring may be performed in an inert atmosphere.

In the first metal core, preferably, the formation of the surface oxide film may be substantially completely prevented. Specifically, in the first metal core according to an embodiment of the present invention, the $2p_{3/2}$ peak of the first metal oxide may not be substantially shown, and thus $A_1/A_2$ may be substantially zero. That is, the first metal core does not have the surface oxide film formed thereon, and thus the first metal may be in direct contact with the second metal.

The second capping layer may contain the second organic acid. Since the second organic acid may be preferentially chemisorbed onto the second metal shell to form a dense organic acid film, the second capping layer may be formed of the second organic acid. That is, the second capping layer may be a film of the second organic acid that is chemisorbed onto the second metal shell. However, a small amount of amine may be included in the first capping layer in the production process using the second organic acid and the second amine-based compound together. As the second metal shell is capped with the second capping layer including the second organic acid, formation of the surface oxide film of the second metal shell may be prevented.

As described above, the second metal shell may be capped by the second capping layer to control the formation of the surface oxide film, and preferably the formation of the surface oxide film may be substantially and completely prevented. Specifically, the second metal shell may satisfy the following Relational Expression 3, and more preferably $A_{11}/A_{12}$ may be 0.01 or less. The $2p_{3/2}$ peak of the second metal oxide is not substantially shown, and thus $A_{11}/A_{12}$ may reach substantially zero.

$$A_{11}/A_{12} \leq 0.2 \quad \text{[Relational Expression 3]}$$

In Relational Expression 3, $A_{11}/A_{12}$ is a ratio in which a second metal $2p_{3/2}$ peak area ($A_{11}$) of an oxide of the second metal is divided by a second metal $2p_{3/2}$ peak area ($A_{12}$) of the second metal, in X-ray photoelectron spectroscopy spectrum on a surface of the second metal shell. Specifically, the X-ray photoelectron spectroscopy spectrum may be measured using an Al Kα source at a degree of vacuum of $10^{-8}$ or less, and a second metal $2p_{3/2}$ peak of the second metal and a second metal $2p_{3/2}$ peak of the second metal oxide may be extracted, thereby calculating a degree of oxidation through an area ratio between two peaks.

The metal of the second metal precursor may be one or two or more selected from the group consisting of copper, silver, gold, nickel, tin, aluminum and an alloy thereof, which is different from the kind of the first metal. The second metal precursor may be one or more inorganic salts selected from the group consisting of nitrate, sulfate, acetate, phosphate, silicate and hydrochloride of a metal selected from the group consisting of copper, silver, gold, nickel, tin, aluminum and an alloy thereof. In the second solution, the second metal precursor may be added in a content of 0.1 to 1 mol based on 1 mol of the first metal nanoparticle.

The second organic acid may have at least one of a straight chain form, a branched form or a cyclic form having 6 to 30 carbon atoms, and may be one or two or more selected from saturated or unsaturated acids. More specifically, the second organic acid may be one or two or more selected from the group consisting of oleic acid, lysine oleic acid, stearic acid, hydroxystearic acid, linoleic acid, aminodecanoic acid, hydroxydecanoic acid, lauric acid, decenoic acid, undecenoic acid, palmitoleic acid, hexyldecanoic acid, hydroxypalmitic acid, hydroxymyristic acid, hydroxydecanoic acid, palmitoleic acid, and myristoleic acid, etc., but is not limited thereto, and may be the same as or different from the first organic acid. In the second solution, a molar ratio of the second metal precursor and the second organic acid may be 1 (metal precursor):0.2 to 4 (acid).

The second amine-based compound may have at least one of a straight chain form, a branched form or a cyclic form having 6 to 30 carbon atoms, and may be one or two or more selected from saturated and unsaturated amine. More specifically, the second amine-based compound may be selected from hexylamine, heptylamine, octylamine, dodecylamine, 2-ethylhexylamine, 1,3-dimethyl-n-butylamine, and 1-aminotridecane, etc., but is not limited thereto, and may be the same as or different from the first amine-based compound. A content of the second amine-based compound in the second solution is 0.2 mol or more, preferably 1 to 50 mol, and more preferably 5 to 50 mol based on 1 mol of the second metal precursor, but the upper limit is not necessarily limited since the second amine-based compound may act as the non-aqueous solvent.

The second reducing agent may be one or two or more selected from hydrazine-based reducing agents including hydrazine, hydrazine anhydride, hydrazine hydrochloride, hydrazine sulfate, hydrazine hydrate, and phenylhydrazine. Further, in addition thereto, the second reducing agent may be one or two or more selected from hydride-based; borohydride-based including tetrabutylammonium borohydride, tetramethylammonium borohydride, tetraethylammonium borohydride, and sodium borohydride, etc.; sodium phosphate-based; and ascorbic acid, and may be the same as or different from the first reducing agent. In the second solution, the second reducing agent may be included so that a molar ratio of the second reducing agent and the second metal precursor is 1 to 100.

In step a-2), the synthesizing of the core-shell nanostructure is not significantly limited, but in consideration of a reduction efficiency, the synthesizing of the core-shell nanostructure may be performed at 100 to 350° C., more preferably 140 to 300° C., and further more preferably 180 to 280° C., and may be performed in an inert atmosphere. The core-shell nanostructure may be separated and recovered by a conventional method used when recovering the nanoparticle, such as centrifugation.

Next, when the synthesizing of the metal nanoparticle including the first metal satisfying Relational Expression 1 is completed, the ink composition for photonic sintering may be prepared by dispersing the metal nanoparticle together with a non-aqueous organic binder in a non-aqueous solvent.

The non-aqueous organic binder is not particularly limited, but may be any non-aqueous organic binder material that is conventionally used to improve physical binding force of the coating film when preparing the conductive ink. As a specific and non-limiting example, the non-aqueous organic binder may be one or two or more selected from polyvinylidene fluoride (PVDF), polymethylmethacrylate (PMMA), self-crosslinkable acrylic resin emulsion, hydroxyethyl cellulose, ethylhydroxyethyl cellulose, carboxymethyl cellulose, hydroxycellulose, methylcellulose, nitrocellulose, ethylcellulose, styrene butadiene rubber (SBR), a copolymer of C1-C10alkyl(meth)acrylate and unsaturated carboxylic acid, gelatin, thixoton, starch, polystyrene, polyurethane, a resin including a carboxylic group, a phenolic resin, a mixture of ethylcellulose and a phenolic resin, an ester polymer, a methacrylate polymer, a self-crosslinking (meth)acrylic acid copolymer, a copolymer having an ethylenic unsaturated group, an ethylcellulose-based material, an acrylate-based material, an epoxy resin-based material, and a mixture thereof.

As a more specific example, the non-aqueous organic binder may be a non-aqueous polymer material having an amine value of 5 to 150 mgKOH/g. The non-aqueous polymer material may simultaneously perform a role of a binder and a dispersant. In particular, the non-aqueous organic binder may be a copolymer of an unsaturated carboxylic acid or a graft polymer thereof, and may be a copolymer of an unsaturated carboxylic acid having an amine value of 5 to 150 mgKOH/g or a graft polymer thereof. The non-aqueous organic binder does not interfere with binding between the metal particles at the time of photonic sintering, while simultaneously acting as the binder and the dispersant, and thus a metal thin film that is more compact and has excellent conductivity may be produced. The copolymer of unsaturated carboxylic acid or the graft polymer thereof having an amine value of 5 to 150 mg KOH/g may include a copolymer of C1-C10alkyl(meth)acrylate and unsaturated carboxylic acid, a copolymer of polyetherketone and unsaturated carboxylic acid, a copolymer of polyacrylamide and unsaturated carboxylic acid, a copolymer of polyethylene oxide and unsaturated carboxylic acid, a copolymer of polyethylene glycol and unsaturated carboxylic acid or a mixture thereof. The copolymer of unsaturated carboxylic acid or the graft polymer thereof having an amine value of 5 to 150 mg KOH/g may have a molecular weight (weight average molecular weight) of 1000 to 50,000 g/mol.

As the non-aqueous organic binder, a commercial product containing the non-aqueous organic binder material may be used. Specific examples of the non-aqueous organic binder may include BYK130, BYK140, BYK160, BYK161, BYK162, BYK163, BYK164, BYK165, BYK167, BYK169, BYK170, BYK171, BYK174 EFKA 4610, EFKA 4644, EFKA 4654, EFKA 4665, EFKA 4620, EFKA 4666, EFKA 4642, or the like, but the non-aqueous organic binder is not limited thereto.

The non-aqueous solvent is not particularly limited, but preferably may be one or two or more selected from the group consisting of alkane having 6 to 30 carbon atoms, amine, toluene, xylene, chloroform, dichloromethane, tetradecane, octadecene, chlorobenzene, dichlorobenzene, chlorobenzoic acid, and dipropylene glycol propyl ether.

In an embodiment of the present invention, the ink composition for photonic sintering may contain 0.05 to 5 parts by weight of the non-aqueous organic binder and 20 to 800 parts by weight of the non-aqueous solvent, based on 100 parts by weight of the metal nanoparticle.

According to an embodiment of the present invention, the non-aqueous organic binder may remain on the conductive metal thin film without impairing inherent physical properties thereof at the time of photonic sintering. Accordingly, when the content of the non-aqueous organic binder in the conductive ink composition is extremely high, densification between the metal nanoparticles may be inhibited by the polymer binder that binds between the metal nanoparticles or between the metal nanoparticle and the substrate. A content range of 0.05 to 5 parts by weight of the non-aqueous organic binder based on the particles may be a range in which the densification between metal nanoparticles may not be interfered, and a coating film having physical strength in which a shape is stably maintained when the applied ink composition is dried and having excellent binding force with a substrate may be formed, and at the same time, the binding force between the substrate metal thin films may be remarkably improved by the polymer binder remaining in the metal thin film after photonic sintering.

The conductive ink composition may contain 20 to 800 parts by weight of a non-aqueous solvent to have proper fluidity for coating or printing even though it may vary to some extent depending on an application method of the conductive ink composition.

Further, in the preparation method of the ink composition for photonic sintering according to an embodiment of the present invention, the dispersion of step b) may further include a low melting point metal having a melting point of 800° C. or lower.

More specifically, the ink composition for photonic sintering may contain 0.1 to 50 parts by weight of a low-melting point metal, 0.05 to 5 parts by weight of a non-aqueous organic binder and 20 to 800 parts by weight of a non-aqueous solvent, based on 100 parts by weight of the metal nanoparticle.

The low melting point metal having a melting point of 800° C. or lower may be prepared by a method similar to that of the metal nanoparticle. The low melting point metal to be prepared may be obtained in the same manner as the metal nanoparticle except that a precursor and a content thereof are changed according to the kind of the metal to be mixed.

As a specific example, it is possible to produce the low melting point metal that prevents a surface oxide film from being formed and is capped with a third capping layer by heating a third solution including a precursor of a low melting point metal to be prepared, a third organic acid, a third amine-based compound, and a third reducing agent. However, the heating and stirring may be performed in an inert atmosphere.

Here, the third capping layer may contain the third organic acid. Since the third organic acid may be preferentially chemisorbed onto the low melting point metal particle to form a dense organic acid film, the third capping layer may be formed of the third organic acid. That is, the third capping layer may be a film of the organic acid that is chemisorbed onto the low melting point metal particle. However, a small amount of amine may be included in the third capping layer in the production process using the third organic acid and the third amine-based compound together. As the low melting point metal is capped with the third capping layer including the third organic acid, formation of the surface oxide film of the low melting point metal may also be prevented.

The precursor of the low melting point metal to be prepared may be two or more kinds. For example, the metal of the precursor of the low melting point metal may be two or more selected from copper, tin, silver, bismuth, zinc, indium and lead. More specifically, the precursor of the low melting point metal may be one or more inorganic salts selected from the group consisting of nitrate, sulfate, acetate, phosphate, silicate and hydrochloride of two or more metals selected from the group consisting of copper, tin, silver, bismuth, zinc, indium and lead. Here, when the selected metal is copper and tin, respective precursors may be inorganic salts that are the same as or different from each other. As a preferred example, the precursor of the low melting point metal may be a copper salt and a tin salt.

The third organic acid may have at least one of a straight chain form, a branched form or a cyclic form having 6 to 30 carbon atoms, and may be one or two or more selected from saturated or unsaturated acids. More specifically, the third organic acid may be one or two or more selected from the group consisting of oleic acid, lysine oleic acid, stearic acid, hydroxystearic acid, linoleic acid, aminodecanoic acid, hydroxydecanoic acid, lauric acid, decenoic acid, undecenoic acid, palmitoleic acid, hexyldecanoic acid, hydroxypalmitic acid, hydroxymyristic acid, hydroxydecanoic acid, palmitoleic acid, and myristoleic acid, etc., but is not limited thereto. In the third solution, a molar ratio of the precursor of the low melting point metal and the third organic acid may be 1 (precursor of low melting point metal):0.2 to 4 (acid).

The third amine-based compound may have at least one of a straight chain form, a branched form or a cyclic form having 6 to 30 carbon atoms, and may be one or two or more selected from saturated and unsaturated amine. More specifically, the third amine-based compound may be selected from hexylamine, heptylamine, octylamine, dodecylamine, 2-ethylhexylamine, 1,3-dimethyl-n-butylamine, and 1-aminotridecane, etc., but is not limited thereto. A content of the third amine-based compound in the third solution is 0.2 mol or more, preferably 1 to 50 mol, and more preferably 5 to 50 mol based on 1 mol of the precursor of the low melting point metal, but the upper limit is not limited since the third amine-based compound may act as the non-aqueous solvent.

The third reducing agent may be one or two or more selected from hydrazine-based reducing agents including hydrazine, hydrazine anhydride, hydrazine hydrochloride, hydrazine sulfate, hydrazine hydrate, and phenylhydrazine. Further, in addition thereto, the third reducing agent may be one or two or more selected from hydride-based; borohydride-based including tetrabutylammonium borohydride, tetramethylammonium borohydride, tetraethylammonium borohydride, and sodium borohydride, etc.; sodium phosphate-based; and ascorbic acid. In the third solution, the third reducing agent may be included so that a molar ratio of the third reducing agent and the precursor of the low melting point metal is 1 to 100.

The synthesizing of the low melting point metal nanoparticle is not significantly limited, but in consideration of a reduction efficiency, the synthesizing of the low melting point metal nanoparticle may be performed at 100 to 350° C., more preferably 140 to 300° C., and further more preferably 180 to 280° C., and may be performed in an inert atmosphere. The low melting point metal nanoparticle may be separated and recovered by a conventional method used when recovering the nanoparticle, such as centrifugation.

Further, still another aspect of the present invention relates to a production method of a photonic sintering conductive thin film and a photonic sintering conductive thin film produced therefrom.

In detail, the production method of a photonic sintering conductive thin film may include: A) preparing an ink composition for photonic sintering including a metal nanoparticle including a first metal satisfying the following Relational Expression 1; a non-aqueous organic binder; and a non-aqueous solvent; B) applying the ink composition for photonic sintering to a substrate to form a coating film; and C) irradiating the coating film with light so as to satisfy the following Relational Expression 2, thereby producing a conductive thin film, $$A_1/A_2 \leq 0.2 \quad \text{[Relational Expression 1]}$$

$$I_{LS} \leq I_c \quad \text{[Relational Expression 2]}$$

in Relational Expression 1, $A_1/A_2$ is a ratio in which a first metal $2p_{3/2}$ peak area ($A_1$) of an oxide of the first metal is divided by a first metal $2p_{3/2}$ peak area ($A_2$) of the first metal, in X-ray photoelectron spectroscopy spectrum on a surface of the first metal, and in Relational Expression 2, $I_{LS}$ is energy (J/cm$^2$) of light irradiated onto the coating film, and $I_c$ is the maximum energy (J/cm$^2$) of light in which an organic substrate is not deteriorated.

Here, the preparation method of the ink composition for photonic sintering is the same as described above. That is, step A) may be performed by the same method as step a) and step b).

When the ink composition for photonic sintering is prepared through steps a) and b), step B) of applying the ink composition for photonic sintering to a substrate to form a coating film may be performed.

In step B) according to an embodiment, the applying of the ink composition for photonic sintering may be performed by a method of coating or printing. As a specific example, the coating may be performed by dip coating, spin coating, spray coating, casting, or the like, and the printing may be performed by screen printing, inkjet printing, hydrostatic printing, microcontact printing, imprinting, gravure printing, reverse offset printing, gravure offset printing, or the like. The applying of the ink composition for photonic sintering may be applied to have an appropriate pattern according to design of a product to be manufactured, and selectively, after the ink composition for photonic sintering may be applied to a transparent polymer substrate, drying for volatilizing the solvent may be performed before the light irradiation.

The substrate to which the ink composition for photonic sintering is applied may be varied depending on the field to which the photonic sintering conductive thin film is applied, and may be any substrate as long as it is a substrate having insulation property.

As an example, a polyethylene terephthalate (PET) substrate has excellent flexibility, excellent light transmittance, excellent chemical stability to an organic solvent, and is not adsorbed well on water, and is capable of being formed into a film by melt-extrusion, which is a low cost process, thereby having great commercial value. However, since the maximum processing temperature of the polyethylene terephthalate substrate has a range of 80 to 150° C., the conventional photonic sintering method has great difficulty in forming a conductive thin film on the polyethylene terephthalate substrate. However, the production method according to an embodiment of the present invention may produce a conductive thin film through an extremely low light energy, and as a result, as shown in the following Examples, a conductive thin film having significantly excellent electrical conductivity even on the polyethylene terephthalate substrate requiring an extremely low processing temperature may be produced.

As described above, according to the characteristics of the present invention, the substrate may be any substrate as long as it is a substrate having insulation property. Specific and non-limiting examples of the substrate may include an organic substrate such as polyethylene terephthalate, polyethylene naphthalate, polyetheretherketone, polycarbonate, polyarylate, polyether sulfone, polyimide, or the like, an inorganic substrate such as glass, paper, or the like.

Next, a step of irradiating the coating film with light to produce a conductive thin film may be performed.

Generally, it is known that sintering of the metal nanoparticle at the time of photonic sintering is achieved by instantaneous melting of a surface area of metal nanoparticles due to high energy applied by light. In order to sinter these metal nanoparticles, light substantially having a light quantity of 10 J/cm$^2$ or more is irradiated.

On the other hand, when the ink composition for photonic sintering according to the present invention is used, sintering may be effectively performed without damaging the substrate even when light having extremely low light intensity is irradiated. Further, surprisingly, the ink composition may be sintered so as to have electrical conductivity comparable to that of the bulk even in a state in which the polymer binder is not carbonized but remains while maintaining original physical properties of the polymer binder.

Specifically, in step C), light may be irradiated onto the coating film so as to satisfy Relational Expression 2, thereby producing a conductive thin film:

$$I_{LS} \leq I_c \quad \text{[Relational Expression 2]}$$

in Relational Expression 2, $I_{LS}$ is energy (J/cm$^2$) of light irradiated onto the coating film, and $I_c$ is the maximum energy (J/cm$^2$) of light in which an organic substrate is not deteriorated.

Accordingly, it is possible to produce a conductive thin film having an electrical conductivity comparable to that of the bulk in the state in which the non-aqueous organic binder contained in the ink is not carbonized but remains on a thin film while maintaining physical properties of the binder itself, preventing deterioration of a low-cost transparent polymer substrate such as polyethersulfone (PES), polyethylene naphthalate (PEN), polyethylene terephthalate (PET), or the like, and having remarkable binding force with the substrate.

This photonic sintering condition has not been known and has not been studied in the field of a production method of metal wiring using photonic sintering according to the related art, and is a condition that is only obtained when photonic sintering the ink composition containing the metal nanoparticle including the first metal satisfying Relational Expression 1.

That is, the production method of the conductive thin film according to the present invention may have a characteristic constitution in which a light quantity of light that is sintered so as to have electrical conductivity comparable to that of the bulk is lower than a light quantity of light that does not deteriorate the organic substrate even without carbonizing the polymer binder.

Since the polymer binder mixed with the metal nanoparticle may remain and thermal stability is excellent enough not to deteriorate the organic substrate, the method is advantageous in that it is possible to produce a conductive metal thin film having excellent electrical conductivity comparable to that of the bulk without damaging the substrate even if the substrate has a very low upper temperature limit of 100° C. or less, and it is possible to produce a conductive metal thin film which is very suitable for flexible components since binding force between the metal thin film and the substrate is excellent due to the remaining polymer binder. In addition, since the photonic sintering process may be used, it is possible to produce a film having a large area in a very short time under the atmosphere environment, which is an advantage of the photonic sintering, and a roll-to-roll process may be implemented, and thus commerciality may be excellent, the process may be simplified, and production cost may be reduced.

More specifically, the light irradiated onto the coating film may vary depending on characteristics of the ink composition for photonic sintering.

As a specific example, when the metal nanoparticle included in the ink composition for photonic sintering in step A) is a core-shell nanostructure, a conductive thin film may be produced through light irradiation with an extremely low energy. More specifically, the metal nanoparticle may be a core-shell nanostructure including the first metal as the core, the second metal shell surrounding the core; and the capping layer surrounding the second metal shell.

In this case, it is possible to produce a conductive thin film in which a perfect solid solution is formed by irradiating the coating film with light having an extremely low light quantity satisfying Relational Expression 2.

As described above, by irradiating light according to Relational Expression 2 in the production method according to an embodiment of the present invention, a perfect solid solution may be formed, and a conductive metal thin film in which the polymer binder remains while having electrical conductivity comparable to that of the bulk may be produced.

As a specific example, in step C), light having a light quantity of 2.6 J/cm$^2$ or less may be irradiated. In particular, in the case of the ink composition for photonic sintering including a core-shell nanostructure composed of a copper core and a nickel shell, the ink composition may be sintered through light irradiation with an extremely low light quantity of 2.6 J/cm$^2$ or less to form the perfect solid solution, and thus the conductive thin film produced from the ink composition may have excellent electrical conductivity and improved moisture resistance.

In still another specific embodiment, the ink composition for photonic sintering in step A) may further include a low melting point metal having a melting point of 800° C. or less, and in this case, the conductive thin film having excellent electrical conductivity may be produced by irradiating light onto the coating film so as to satisfy Relational Expression 2.

As a specific example, when the conductive ink for photonic sintering further includes a low melting point metal having a melting point of 800° C. or less, in step C), light having energy of 1.3 J/cm$^2$ or less may be irradiated. In particular, in the case of an ink composition for photonic sintering including a copper metal nanoparticle and a copper-tin-based alloy, the ink composition may be sintered through light irradiation with extremely low energy of 1.3 J/cm$^2$ or less, and may have excellent photonic sintering ability, thereby having excellent electrical conductivity.

Meanwhile, in the production method according to an embodiment of the present invention, step C) may be performed by continuously irradiating light in a wavelength band of 200 to 800 nm. Light in a wavelength band of 200 to 800 nm is a wavelength band including light in a visible light band. The light in a wavelength band of 200 to 800 nm may be irradiated to cause photonic sintering between the core-shell nanostructures, thereby minimizing thermal damage to the substrate.

More specifically, step C) may be performed by continuously irradiating light in a wavelength band of 370 to 800 nm, more specifically, light in a wavelength band of 400 to 800 nm. The irradiation of the light having the wavelength band of 370 to 800 nm, specifically the light having the wavelength band of 400 to 800 nm means that photonic sintering is achieved by visible light rather than ultraviolet rays having strong energy.

The photonic sintering by visible light is achieved by a characteristic of photonic sintering of the metal nanoparticle by being capped with the capping layer including the organic acid to prevent the formation of the surface oxide film, and thus a surface thereof maintains properties of the metal rather than an oxide. As the photonic sintering is performed by visible light irradiation, the substrate may be remarkably free from thermal damage as compared to ultraviolet light irradiation.

In the production method according to an embodiment of the present invention, step C) may be performed by continuously irradiating light for 1 to 2 msec. That is, according to an embodiment of the present invention, light may be irradiated for an extremely short time of 1 to 2 msec to produce a conductive thin film which is a solid solution that forms a perfectly uniform phase. Further, in the conventional photonic sintering of an ink containing a metal nanoparticle, since light with high energy is irradiated for sintering the metal nanoparticle, it is general to irradiate light in a pulse form of an extreme wave in order to prevent damage to the substrate or the like and to perform sintering at a minimum temperature.

The time of light irradiation may affect a substantial temperature of a thin film (the coating film to which light is irradiated) and a substantial temperature of the substrate at the time of the photonic sintering process by accumulation of heat generated by the light. In consideration of a material of a substrate, or the like, an irradiation time of light may be appropriately changed. However, when light in a wavelength band of 200 to 800 nm, preferably, 370 to 800 nm, and more preferably 400 to 800 nm is continuously irradiated for less than 1 msec, inhomogeneous photonic sintering may occur, and there is a risk that it is difficult to produce a metal thin film having a large area. When the light is continuously irradiated for more than 2 msec, a substrate having poor thermal resistance characteristic such as a polyethylene terephthalate substrate may be damaged by accumulated heat.

However, according to an embodiment of the present invention, it is unnecessary to design a pulse width, a pulse gap, a pulse number, or the like, that is required to be individually specified for each substrate or for each thickness of the metal thin film to be produced, or for each material, and stable photonic sintering may be achieved by continuously irradiating light (continuous light irradiation) for only 1 to 2 msec.

At the time of the photonic sintering, the ink may be applied on a substrate with a previously designed pattern to form the coating film, and then the coating film may be dried, wherein the drying may be performed at room temperature, but is not specifically limited thereto. The substrate on which the coating film is formed may be surface-irradiated with light. That is, in the entire region of the substrate on which the coating film is formed, light having an intensity of 1200 W/cm$^2$ or less, and having a wavelength band of 200 to 800 nm, preferably 370 to 800 nm, and more preferably 400 to 800 nm, may be irradiated, preferably for 1 to 2 msec.

A thickness of the photonic sintering conductive thin film produced by the production method is not specifically limited, but may be 0.1 to 50 μm.

Hereinafter, the production method according to the present invention will be described in detail with reference to Examples. Meanwhile, the following Examples are provided as a reference for explaining the present invention in detail, and therefore, the present invention is not limited thereto, but may be implemented in various ways.

Unless defined otherwise, all technical and scientific terms used herein have the same meanings generally understood by those skilled in the art to which the present invention pertains. Terms used in the specification of the present invention are to effectively describe specific exemplary embodiments, but are not intended to limit the present invention.

In addition, unless otherwise stated in the specification, additives may be used in the unit of wt %.

Production Example 1

Octylamine (1.410 mol), oleic acid (0.200 mol) and copper II acetate (0.140 mol) were mixed in a nitrogen atmosphere, and heated to 90° C. Then, phenylhydrazine (1.960 mol) as a reducing agent was injected to prepare a reaction solution. The reaction solution was heated to 150° C. and reacted for 5 minutes. After cooling to room temperature, particles were extracted by centrifugation, and washed with toluene to synthesize copper nanoparticles having an average size of 60 nm.

The thus produced copper nanoparticles were analyzed by a transmission electron microscope. As a result, it could be appreciated from FIG. 1 that a capping layer having a thickness of about 1 nm was formed on a copper core of a monocrystal. Further, as a result of analysis of C 1s and O 1s peaks using X-ray photoelectron spectroscopy, it was confirmed that the capping layer was formed by oleic acid having an alkyl chain (C—C) and a carboxylate (—COO$^-$) moiety.

Further, X-ray photoelectron spectroscopy spectrum of the copper nanoparticles was analyzed, and as a result, it could be confirmed that the copper nanoparticles were capped by the capping layer, thereby preventing formation of the surface oxide film, and it could be confirmed from FIG. 2 that $A_1/A_2$ reached substantially zero.

Production Example 2

Figure 3:
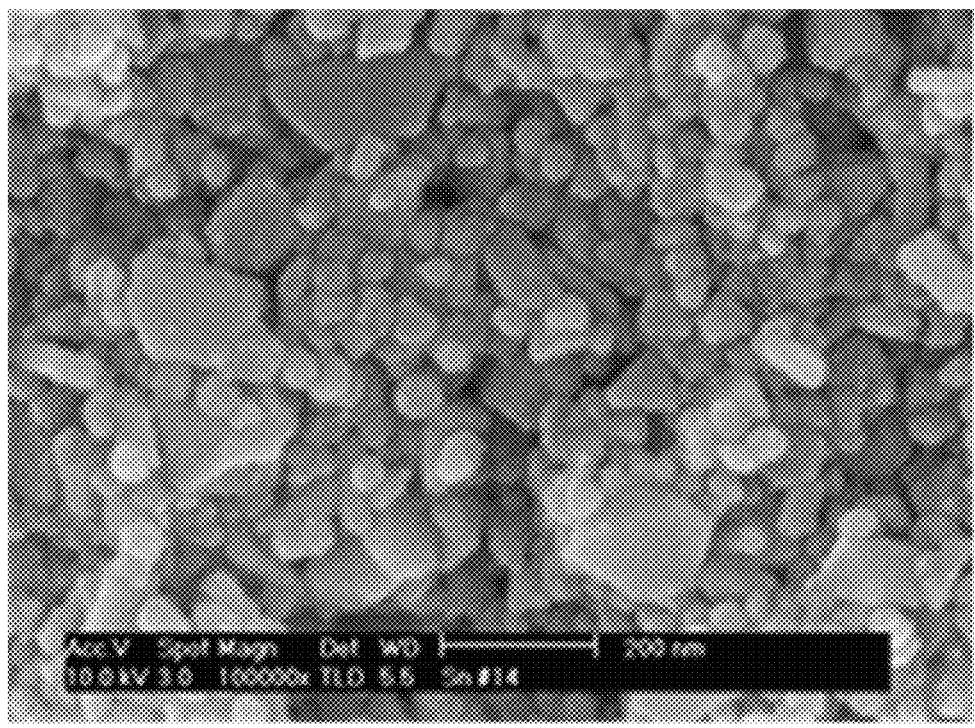
FIG. 3 is a scanning electron microscope image of core-shell alloy nanoparticles produced according to Production Example 2 which is an example of the present invention.
Figure 4:
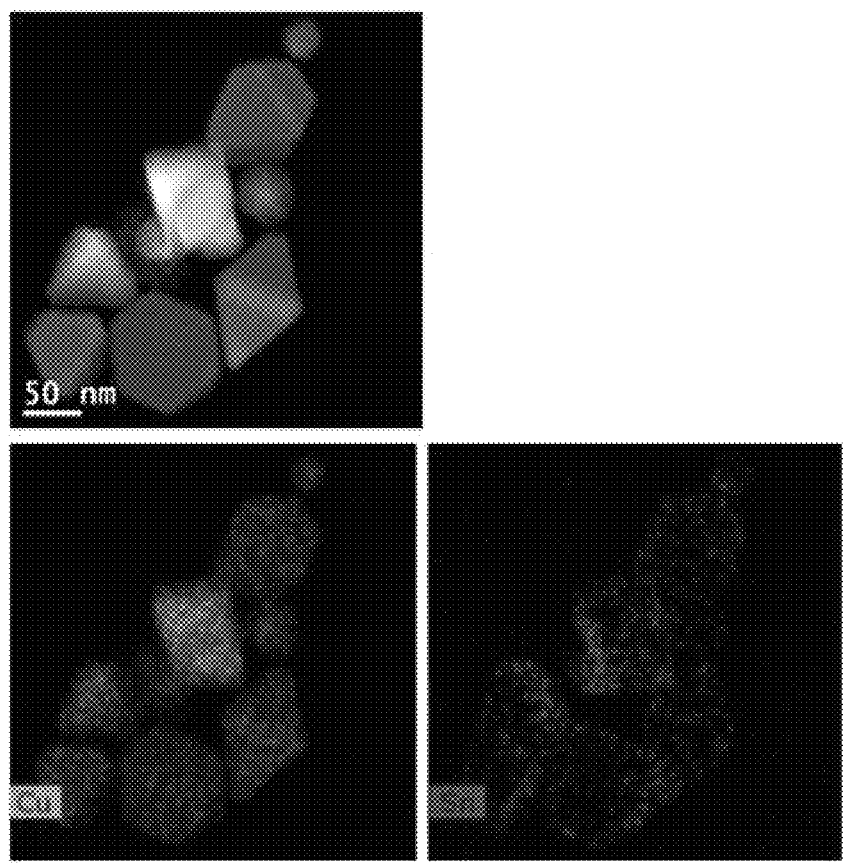
FIG. 4 is a transmission electron microscope image of core-shell alloy nanoparticles produced according to Production Example 2 which is an example of the present invention.
Figure 5:
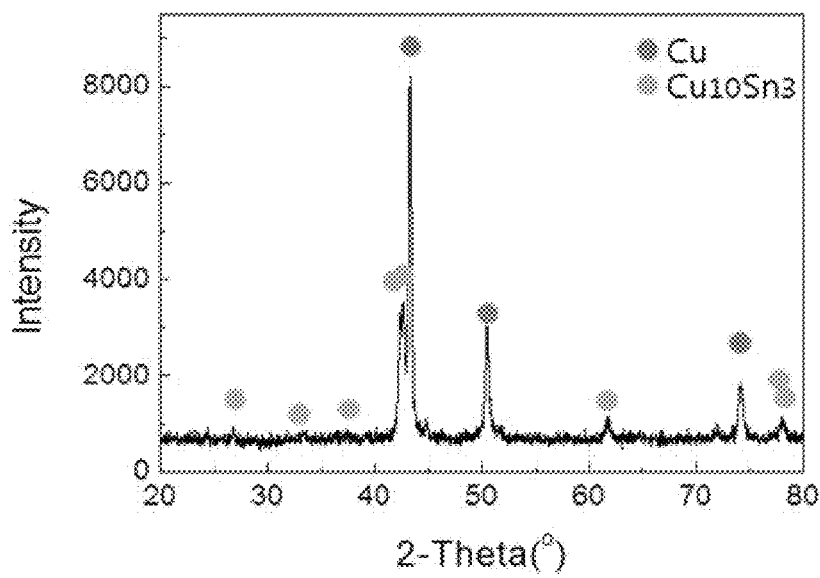
FIG. 5 shows an X-ray diffraction pattern of the core-shell alloy nanoparticles produced according to Production Example 2 which is an example of the present invention.

Oleylamine (0.188 mol), oleic acid (0.0135 mol), copper acetate (0.014 mol), and tin(II) 2-ethylhexanoate (0.005 mol) were mixed in a nitrogen atmosphere, and heated to 220° C. Then phenylhydrazine (0.261 mol) as a reducing agent was injected to prepare a reaction solution. The reaction solution was reacted for 60 minutes and cooled to room temperature, particles were extracted by centrifugation and washed with toluene to synthesize copper nanoparticles having a core-shell type in which a surface is coated with $Sn_3Cu_{10}$, and an average size is 50 nm, wherein a weight ratio of synthesized copper and $Sn_3Cu_{10}$ was 73.8:16.8. Shapes of the synthesized core-shell nanoparticles are shown in FIGS. 3 and 4, and the crystal phase is shown in FIG. 5.

Production Example 3

Oleylamine (0.188 mol), oleic acid (0.0135 mol), copper acetate (0.014 mol), and nickel(II) acetylacetonate (0.019 mol) were mixed in a nitrogen atmosphere, and heated to 220° C. Then phenylhydrazine (0.261 mol) as a reducing agent was injected to prepare a reaction solution. The reaction solution was reacted for 60 minutes, and cooled to room temperature. Then, particles were extracted by centrifugation, and washed with toluene to synthesize nickel nanoparticles having an average size of 40 nm.

Production Example 4

Octylamine (1.410 mol), oleic acid (0.200 mol) and copper II acetate (0.140 mol) were mixed in a nitrogen atmosphere, and heated to 150° C. Then, phenylhydrazine (1.960 mol) as a reducing agent was injected to prepare a first reaction solution. The first reaction solution was reacted for 5 minutes, and cooled to room temperature. Then, particles were extracted by centrifugation, and washed with toluene, and the copper nanoparticles were analyzed by a transmission electron microscope. As a result, it was confirmed that a capping layer having a thickness of about 1 nm was formed on a copper core of a monocrystal. Further, as a result of analysis of C 1s and O 1s peaks using X-ray photoelectron spectroscopy, it was confirmed that the capping layer was formed by oleic acid having an alkyl chain (C—C) and a carboxylate (—COO$^-$) moiety.

Figure 6:
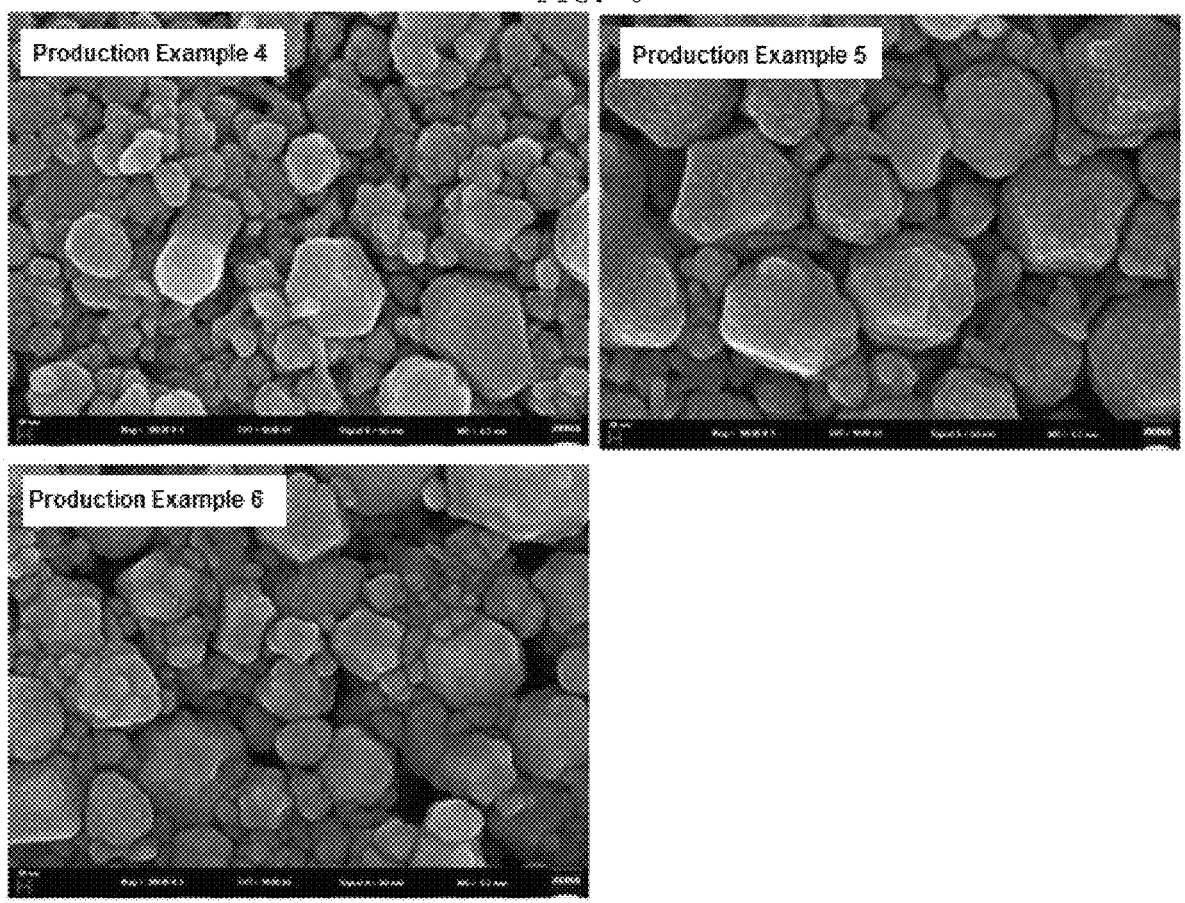
FIG. 6 is a scanning electron microscope image of a copper core-nickel shell nanostructure produced according to an example of the present invention.

The synthesized copper nanoparticles (2.41 g) (0.038 mol) were dispersed in 143.68 g of toluene, and 4.881 g (0.019 mol) of nickel(II) acetylacetonate and 4.237 g (0.015 mol) of oleic acid were mixed in a nitrogen atmosphere and heated to 240° C. Then, 29.097 g (0.269 mol) of phenylhydrazine as a reducing agent was injected to prepare a second solution. After completion of the reaction for 1 hour, a second solution and chloroform were mixed in a volume ratio of 1:1. Then, the copper core-nickel shell nanostructure was collected by centrifugation, and the particles were washed with a mixed solvent in which toluene and chloroform are mixed at a volume ratio of 1:1. A scanning electron microscope image of the obtained copper core-nickel shell nanoparticles is shown in FIG. 6A. Here, as a result of analyzing the X-ray photoelectron spectroscopy spectrum of the copper core, it could be confirmed that since the copper nanoparticles capped with the capping layer were used, the formation of the surface oxide film was prevented even in the copper core, and $A_1/A_2$ reached substantially zero.

Production Example 5

Figure 7:
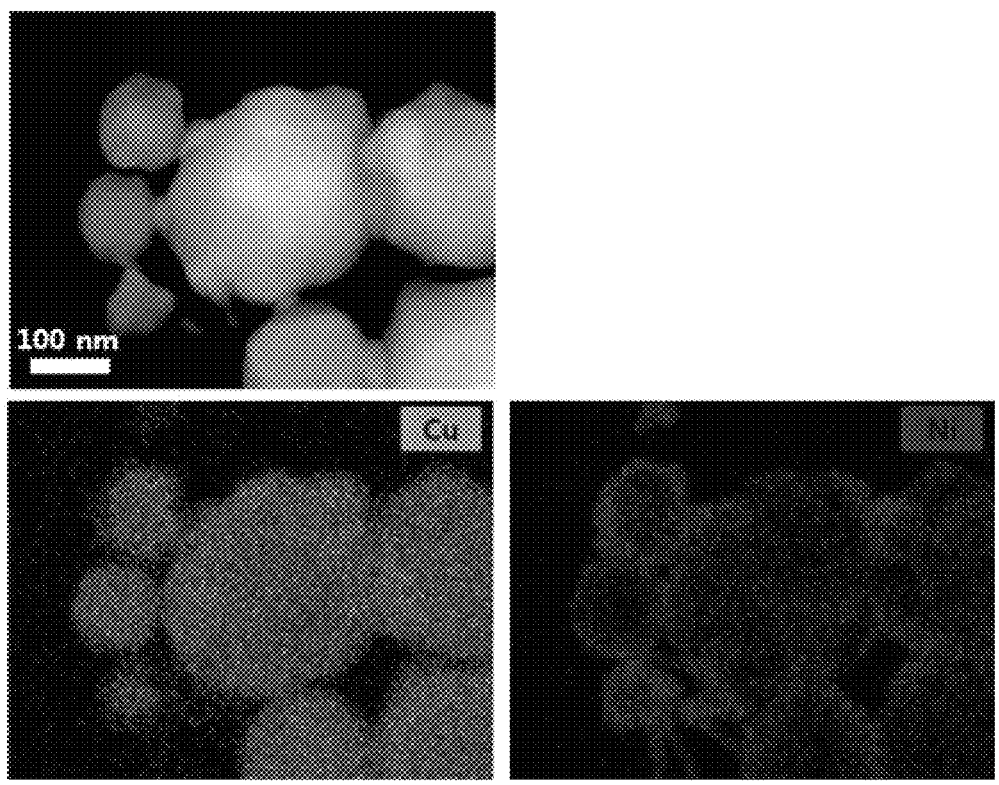
FIG. 7 is a transmission electron microscope image of a copper core-nickel shell nanostructure produced according to an example of the present invention.

All processes were performed in the same manner as in Production Example 4 except that contents of the copper nanoparticles and the nickel(II) acetylacetonate were changed, that is, 3.02 g (0.048 mol) of copper nanoparticles and 4.881 g (0.019 mol) of nickel(II) acetylacetonate were added. A scanning electron micrograph image of the obtained copper core-nickel shell nanoparticles is shown in FIG. 6B, and a transmission electron microscope image is shown in FIG. 7.

Production Example 6

All processes were performed in the same manner as in Production Example 4 except that contents of the copper nanoparticles and the nickel(II) acetylacetonate were changed, that is, 3.62 g (0.057 mol) of copper nanoparticles and 4.881 g (0.019 mol) of nickel(II) acetylacetonate were added. A scanning electron microscope image of the obtained copper core-nickel shell nanoparticles is shown in FIG. 6C.

Example 1

The copper nanoparticles produced in Production Example 1 and the core-shell nanoparticles produced in Production Example were mixed to produce mixed nanoparticles so that a weight ratio of Cu and $Sn_3Cu_{10}$ was 95:5. The mixed nanoparticles (0.7 g) and BYK130 (7 mg) as a polymer binder material were mixed with 99.3 g of toluene, and spray-coated to form a coating film on a polyimide substrate heated to 80° C. By irradiating light so that conditions of [irradiation time (msec), voltage (kV), and light quantity (J/cm$^2$)] are [1.0, 2.3, 1.04], [1.0, 2.5, 1.21], [1.0, 3.0, 1.74], [1.5, 1.8, 0.97], [1.5, 1.9, 1.1], [1.5, 2.0, 1.22], [1.5, 2.3, 1.63], [1.5, 2.5, 1.9], [2.0, 1.8, 1.3], [2.0, 1.9, 1.46], [2.0, 2.0, 1.63], [2.0, 2.3, 2.16] or [2.0, 2.5, 2.52] using a light source (linear B-type for Xenon PLA-2010 sintering system) having a wavelength band of 370 to 800 nm, a conductive thin film having a thickness of 400 to 800 nm was produced, and it was confirmed that the metal thin film was not removed during an adhesion test between the metal thin film and the substrate.

Figure 9:
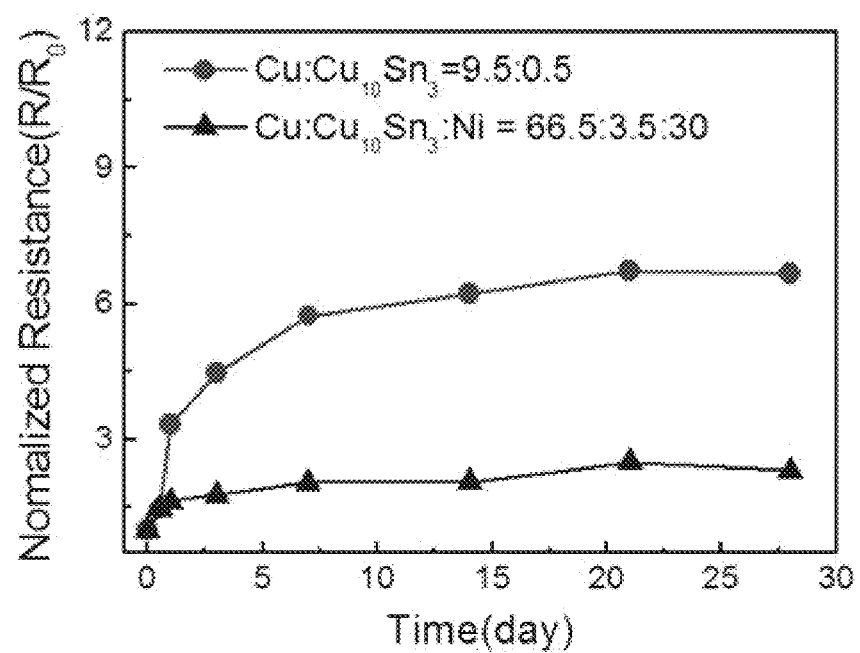
FIG. 9 is a graph showing a change in resistance of the conductive thin films produced according to Example 1 and Example 2.

Specific resistance of the produced conductive metal thin film was measured using a 4-point probe, and shown in Table 1. In addition, for a long-term stability test, a change in resistance according to a storage time under high temperature and high humidity condition of 85%/85 C was measured using the conductive thin film produced by irradiating light under conditions of [1.5 msec, 1.8 kV, 0.97 J/cm$^2$], and shown in FIG. 9.

TABLE 1

| Photonic sintering condition (msec, kV) | Light quantity (J/cm$^2$) | Specific resistance (μΩcm) |
|---|---|---|
| 1.0, 2.3 | 1.04 | 10.59 |
| 1.0, 2.5 | 1.21 | 9.12 |
| 1.0, 3.0 | 1.74 | 11.85 |
| 1.5, 1.8 | 0.97 | 47.7 |
| 1.5, 1.9 | 1.1 | 11.85 |
| 1.5, 2.0 | 1.22 | 10.05 |
| 1.5, 2.3 | 1.63 | 8.79 |
| 1.5, 2.5 | 1.9 | 10.41 |
| 2.0, 1.8 | 1.3 | 14.1 |
| 2.0, 1.9 | 1.46 | 12.96 |
| 2.0, 2.0 | 1.63 | 8.82 |
| 2.0, 2.3 | 2.16 | 7.92 |
| 2.0, 2.5 | 2.52 | 9.84 |

Example 2

All processes were performed in the same manner as in Example 1 except that the copper nanoparticles produced in Production Example 1, the core-shell nanoparticles produced in Production Example 2, and the nickel nanoparticles produced in Production Example 3 were mixed to produce mixed nanoparticles so that a weight ratio of Cu:$Sn_3Cu_{10}$:Ni is 66.5:3.5:30, and the conditions for photonic sintering were changed. A conductive thin film having a thickness of 400 nm was produced by irradiating light under conditions of [1.5 msec, 2.0 kV, 1.22 J/cm$^2$], and the produced conductive thin film had specific resistance of 51.7 μΩcm. For a long-term stability test, a change in resistance according to a storage time under high temperature and high humidity condition of 85%/85 C was analyzed, and shown in FIG. 9.

Example 3

The copper core-nickel shell nanoparticles (0.7 g) synthesized in Production Example 4 and BYK130 (7 mg) as a polymer binder material were mixed with 99.3 g of toluene and spray-coated to form a coating film on a polyimide substrate heated to 80° C. By irradiating light so that conditions of [irradiation time (msec), voltage (kV), and light quantity (J/cm$^2$)] are [1.0, 2.0, 0.77], [1.0, 2.3, 1.04], [1.0, 2.5, 1.21], [1.0, 3.0, 1.74], [1.5, 2, 1.22], [1.5, 2.3, 1.63], [1.5, 2.5, 1.90], [1.5, 3.0, 2.67], [2.0, 2, 1.63], [2.0, 2.3, 2.16], [2.0, 2.5, 2.52] or [2.0, 3.0, 3.49] using a light source (linear B-type for Xenon PLA-2010 sintering system) having a wavelength band of 370 to 800 nm, a conductive copper-nickel thin film having a thickness of 500 nm was produced. The specific resistance of the produced conductive metal thin film was measured using a 4-point probe.

The specific resistance of the conductive metal thin film produced in Example 3 was measured, and as a result, it could be confirmed that when the irradiated light quantity was more than 2.6 J/cm$^2$, the thin film partially peeled off or the thin film completely peeled off. The conductive metal thin film was analyzed by X-ray photoelectron spectroscopy (XPS) to measure the content of the polymer binder remained in the metal thin film for each light quantity of the irradiated light, and as a result, it was confirmed that in the metal thin films produced by irradiation with light quantity of more than 2.6 J/cm² in Examples, all of the polymer binders were substantially carbonized.

On the other hand, it could be appreciated that in the metal thin film produced by irradiation with light quantity of 2.6 J/cm² or less, 60 wt % or more of the polymer binder contained in the dried coating film before the light irradiation remained in the metal thin film even after the light irradiation, and thus the metal thin film having remarkably improved binding force with the substrate was produced.

Figure 8:
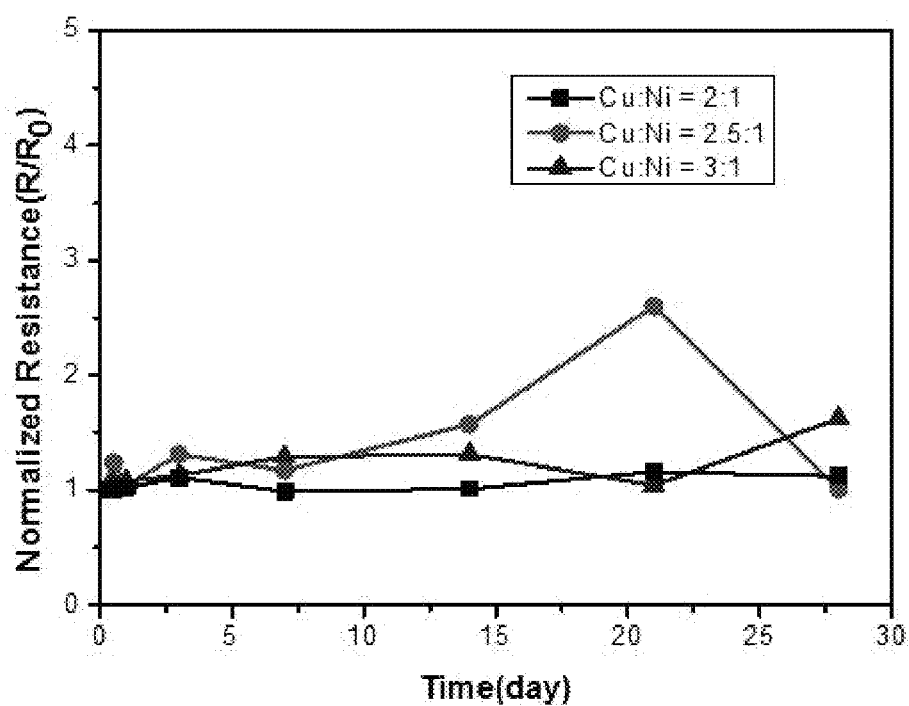
FIG. 8 is a graph showing a change in resistance of a conductive thin film produced according to an example of the present invention.

In addition, for a long-term stability test of the metal thin film produced by photothermal treatment under conditions of [1.5, 2.3, 1.63] among the produced conductive metal thin films, a change in resistance according to storage time under high temperature and high humidity condition of 85%/85 C was analyzed and shown in FIG. 8 (Cu:Ni=2:1).

As could be appreciated from FIG. 8, it could be confirmed that in the metal thin film produced by using the present copper core-nickel shell nanoparticle, the specific resistance was not significantly increased even in a high temperature and high humidity environment, and thus, the moisture resistance was significantly excellent.

Example 4

All processes were performed in the same manner as in Example 3 except that the copper core-nickel shell nanostructure synthesized in Production Example 5 was used. The specific resistance of the produced conductive metal thin film was measured using a 4-point probe, and for a long-term stability test of the metal thin film produced by photothermal treatment under conditions of [1.5, 2.3, 1.63] among the produced conductive metal thin films, a change in resistance according to storage time under high temperature and high humidity condition of 85%/85 C was analyzed and shown in FIG. 8 (Cu:Ni=2.5:1).

Example 5

All processes were performed in the same manner as in Example 3 except that the copper core-nickel shell nanostructure synthesized in Production Example 6 was used. The specific resistance of the produced conductive metal thin film was measured using a 4-point probe, and for a long-term stability test of the metal thin film produced by photothermal treatment under conditions of [1.5, 2.3, 1.63], a change in resistance according to storage time under high temperature and high humidity condition of 85%/85 C was analyzed and shown in FIG. 8 (Cu:Ni=3:1).

The invention claimed is:

1. A production method of a photonic sintering conductive thin film comprising:
A) preparing an ink composition for photonic sintering including a nanoparticle, a non-aqueous organic binder, and a non-aqueous solvent, the nanoparticle comprising a core and a shell, the core comprising a first metal capped with a first capping layer with a capping material that prevents the first metal from oxidizing, the shell comprising a second metal having a melting point of 800° C. or lower,
wherein preparing the ink composition comprises synthesizing the core comprising the first metal capped with the first capping layer by heating and stirring a solution including a first metal precursor, an organic acid, an amine based-compound, and reducing agent,
wherein the first capping layer comprises the organic acid;
B) applying the ink composition to a substrate to form a coating film on the substrate; and
C) irradiating the coating film with visible light having an intensity of 2.6 J/cm² or less in a wavelength band of 400 to 800 nm to produce a conductive thin film,
wherein prior to irradiating, with the presence of the first capping layer in the core, the nanoparticle does not comprise an oxide layer of the first metal in the core such that the nanoparticle satisfies the following Relational Expression 1:

$$A_1/A_2=0 \qquad \text{[Relational Expression 1]}$$

in Relational Expression 1, $A_1/A_2$ is a ratio in which a first metal $2_{p3/2}$ peak area ($A_1$) of an oxide of the first metal is divided by a first metal $2_{p3/2}$ peak area ($A_2$) of the first metal, in X-ray photoelectron spectroscopy spectrum on a surface of the first metal.

2. The production method of claim 1, wherein the nanoparticle further comprises a second capping layer with a capping material that prevents the second metal from oxidizing, wherein the core, the first capping layer, the shell and the second capping layer are sequentially positioned from inside to outside.

* * * * *